United States Patent
Im et al.

(10) Patent No.: US 11,039,235 B2
(45) Date of Patent: Jun. 15, 2021

(54) DISPLAY DEVICE

(71) Applicant: Samsung Display Co., Ltd., Yongin-si (KR)

(72) Inventors: Jae Woo Im, Seoul (KR); Byeong Hee Won, Incheon (KR); Yi Joon Ahn, Seoul (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 0 days.

(21) Appl. No.: 16/739,104

(22) Filed: Jan. 9, 2020

(65) Prior Publication Data

US 2020/0296496 A1 Sep. 17, 2020

(30) Foreign Application Priority Data

Mar. 15, 2019 (KR) .................. 10-2019-0029808

(51) Int. Cl.
*H04R 1/02* (2006.01)
*H04R 9/06* (2006.01)
*H04R 3/00* (2006.01)
*H04R 9/02* (2006.01)
*H04R 9/04* (2006.01)

(52) U.S. Cl.
CPC .............. *H04R 1/028* (2013.01); *H04R 3/00* (2013.01); *H04R 9/022* (2013.01); *H04R 9/025* (2013.01); *H04R 9/045* (2013.01); *H04R 9/06* (2013.01); *H04R 2400/11* (2013.01); *H04R 2499/15* (2013.01)

(58) Field of Classification Search
CPC .......... H04R 1/028; H04R 3/00; H04R 9/022; H04R 9/025; H04R 9/06
See application file for complete search history.

(56) References Cited

U.S. PATENT DOCUMENTS 10,143,098 B1    11/2018  Lee
2003/0031331 A1   2/2003  Harris et al.
(Continued)

FOREIGN PATENT DOCUMENTS

EP      3435682        1/2019
KR      101340704     12/2013
(Continued)

OTHER PUBLICATIONS

Extended European Search Report—European Application No. 20161428.6 dated Aug. 5, 2020, citing references isted within.
(Continued)

*Primary Examiner* — Simon King
(74) *Attorney, Agent, or Firm* — Cantor Colburn LLP

(57) ABSTRACT

A display device includes: a display panel including a first substrate and a light emitting element layer disposed on the first substrate; and a sound generator disposed on one surface of the first substrate, where the sound generator vibrates the display panel to output a sound. The sound generator includes: a first vibration generator which vibrates the display panel by generating a magnetic force using a first voice coil therein; and a second vibration generator including a vibration layer which contracts or expands based on a voltage applied thereto to vibrate the display panel, where the first vibration generator and the second vibration generator overlap each other in a thickness direction of the display panel.

24 Claims, 32 Drawing Sheets

(56) References Cited

U.S. PATENT DOCUMENTS

| | | | |
|---|---|---|---|
| 2006/0140424 A1* | 6/2006 | Kobayashi | H04R 7/045 |
| | | | 381/190 |
| 2007/0177746 A1 | 8/2007 | Kobayashi et al. | |
| 2013/0257744 A1* | 10/2013 | Daghigh | G06F 3/0416 |
| | | | 345/173 |
| 2014/0363041 A1 | 12/2014 | Zhao | |
| 2017/0123281 A1* | 5/2017 | Lee | H01L 27/20 |
| 2017/0289661 A1* | 10/2017 | Hose | H04R 7/04 |
| 2017/0295432 A1 | 10/2017 | Kuksenkov et al. | |
| 2018/0192527 A1 | 7/2018 | Yun et al. | |
| 2018/0324519 A1* | 11/2018 | Park | H04R 9/02 |
| 2019/0037165 A1* | 1/2019 | Lee | H04R 1/26 |
| 2020/0119256 A1* | 4/2020 | Chen | H01L 41/317 |

FOREIGN PATENT DOCUMENTS

| | | |
|---|---|---|
| KR | 101830761 | 2/2018 |
| KR | 1020180092155 | 8/2018 |
| KR | 1020180098504 | 9/2018 |

OTHER PUBLICATIONS

Extended European Search Report—European Application No. EP19217409.2 dated Sep. 18, 2020, citing references listed within.

\* cited by examiner

DISPLAY DEVICE

This application claims priority to Korean Patent Application No. 10-2019-0029808 filed on Mar. 15, 2019, and all the benefits accruing therefrom under 35 U.S.C. § 119, the content of which in its entirety is herein incorporated by reference.

BACKGROUND

1. Field

The disclosure relates to a display device.

2. Description of the Related Art

With the development of information society, demands for display devices for displaying images are increasing in various forms. For example, display devices are used for various electronic appliances such as smart phones, tablet personal computers ("PC"s), digital cameras, notebook computers, navigators, and televisions. The display device may be a flat panel display device such as a liquid crystal display device, a field emission display device, or an organic light emitting display device.

SUMMARY

A display device may include a display panel for displaying an image and a speaker for providing a sound. In such a display device, due to the space restriction of the display device, the speaker may be located on the lower surface or one side of the display panel. In this case, it is desired that the sound output from the speaker is output in the front direction of the display device. However, in a conventional display device, as described above, the speaker may be located on the lower surface or one side of the display panel such that the sound may be output in the back direction of the display device or in a side direction of the display device, thereby deteriorating sound quality.

Embodiments of the invention are to provide a display device which can improve sound quality by vibrating a display panel using a sound generator and thus outputting a sound in the front direction of the display device.

According to an embodiment of the disclosure, a display device includes: a display panel including a first substrate and a light emitting element layer disposed on the first substrate; and a sound generator disposed on one surface of the first substrate, where the sound generator vibrates the display panel to output a sound. In such an embodiment, the sound generator includes: a first vibration generator which vibrates the display panel by generating a magnetic force using a first voice coil therein; and a second vibration generator including a vibration layer which contracts or expands based on a voltage applied thereto to vibrate the display panel, where the first vibration generator and the second vibration generator overlap each other in a thickness direction of the display panel.

In an embodiment, the first vibration generator may include: a bobbin disposed on the one surface of the first substrate; a first voice coil surrounding the bobbin; and a first magnet disposed on the bobbin and spaced apart from the bobbin.

In an embodiment, the second vibration generator may be disposed on the one surface of the first substrate, and may be surrounded by the bobbin.

In an embodiment, the second vibration generator may overlap the first magnet in the thickness direction of the display panel.

In an embodiment, the second vibration generator may be disposed on the one surface of the first substrate, and the bobbin may be disposed on the second vibration generator.

In an embodiment, the second vibration generator may further includes: a first electrode to which a first driving voltage is applied; and a second electrode to which a second driving voltage is applied, where the vibration layer may be disposed between the first electrode and the second electrode, and may contract and expand based on the first driving voltage applied to the first electrode and the second driving voltage applied to the second electrode.

In an embodiment, the vibration layer may include a piezoelectric element

In an embodiment, the sound generator may further include a third vibration generator which vibrates the display panel by generating a magnetic force using a second voice coil therein.

In an embodiment, the second vibration generator and the third vibration generator may be surrounded by the bobbin.

In an embodiment, the third vibration generator may overlap the first vibration generator and the second vibration generator in the thickness direction of the display panel.

In an embodiment, the second vibration generator may be disposed on the one surface of the first substrate, and the third vibration generator may be disposed on the second vibration generator.

In an embodiment, the third vibration generator may overlap the first magnet of the first vibration generator in the thickness direction of the display panel.

In an embodiment, the third vibration generator may overlap the first magnet of the first vibration generator in the thickness direction of the display panel.

In an embodiment, one side surface of the second vibration generator and one side surface of the third vibration generator may be disposed adjacent to each other In an embodiment, one side surface of the second vibration generator and one side surface of the third vibration generator may be in contact with each other In an embodiment, the third vibration generator may include: a lower chassis and an upper chassis facing each other; a flexible circuit board disposed on one surface of the lower chassis facing the upper chassis; a second magnet including a voice coil groove which accommodates the second voice coil; and a spring disposed between the upper chassis and the second magnet, where the second voice coil may be disposed on one surface of the flexible circuit board facing the upper chassis, and may be electrically connected to the flexible circuit board.

In an embodiment, the display device may further comprise a sound circuit board electrically connected to the first electrode and second electrode of the second vibration generator.

In an embodiment, the sound circuit board may be disposed between the one surface of the first substrate and the bobbin.

In an embodiment, the sound circuit board may be in contact with the bobbin

In an embodiment, the display device may further comprise a heat radiation film disposed on the one surface of the first substrate and the sound generator, where the heat radiation film may include an accommodation groove in which the sound circuit board is disposed.

In an embodiment, the bobbin may overlap the accommodation groove in the thickness direction of the display panel.

In an embodiment, the display device may further comprise a lower cover disposed on the heat radiation film; and a circuit board disposed on the lower cover.

In an embodiment, a radio wave blocking member may be disposed on the sound circuit board.

In an embodiment, the first vibration generator may further include a lower plate disposed on the first magnet and fixed to the lower cover or the circuit board by a fixing member.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1A:
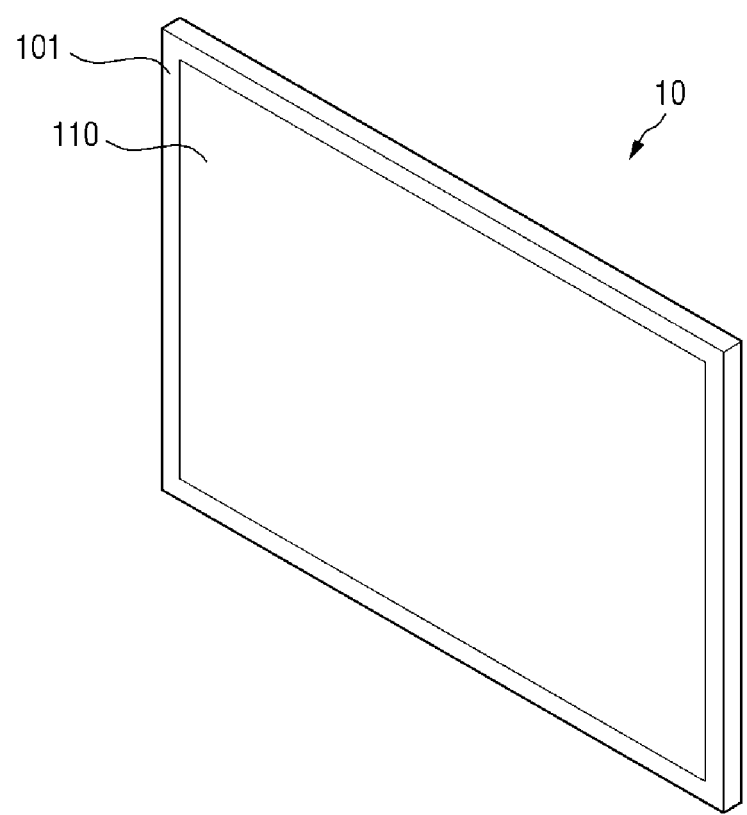
FIGS. 1A and 1B are perspective views of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Herein, for convenience of description, embodiments of a display device 10 where the display device 10 is an organic light emitting display device using an organic light emitting element as a light emitting element, but the invention is not limited thereto. In one alternative embodiment, for example, the display device 10 may be an inorganic light emitting display using a micro light emitting diode or an inorganic semiconductor (inorganic light emitting diode) as a light emitting element.

Figure 1B:
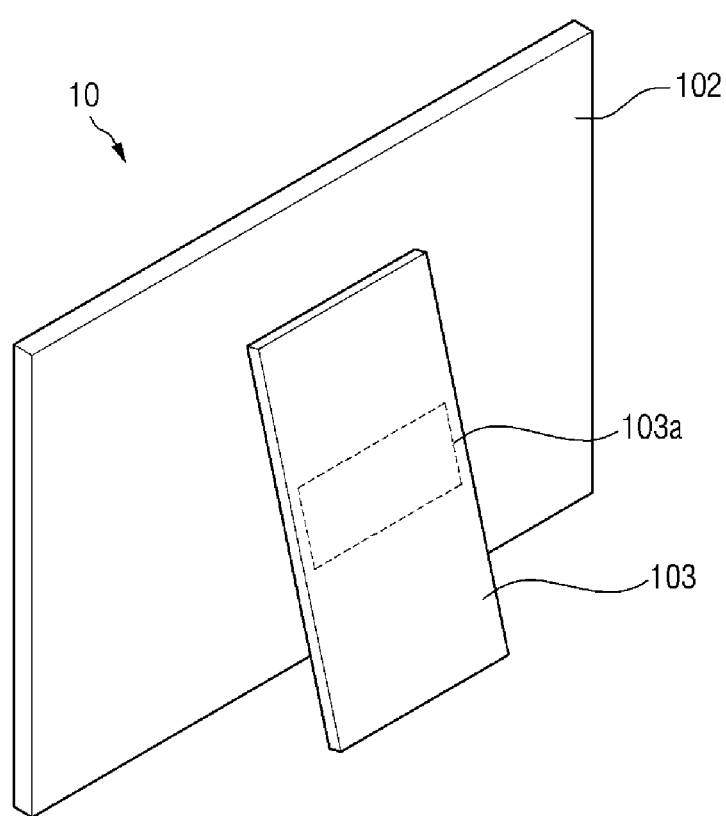
Figure 2:
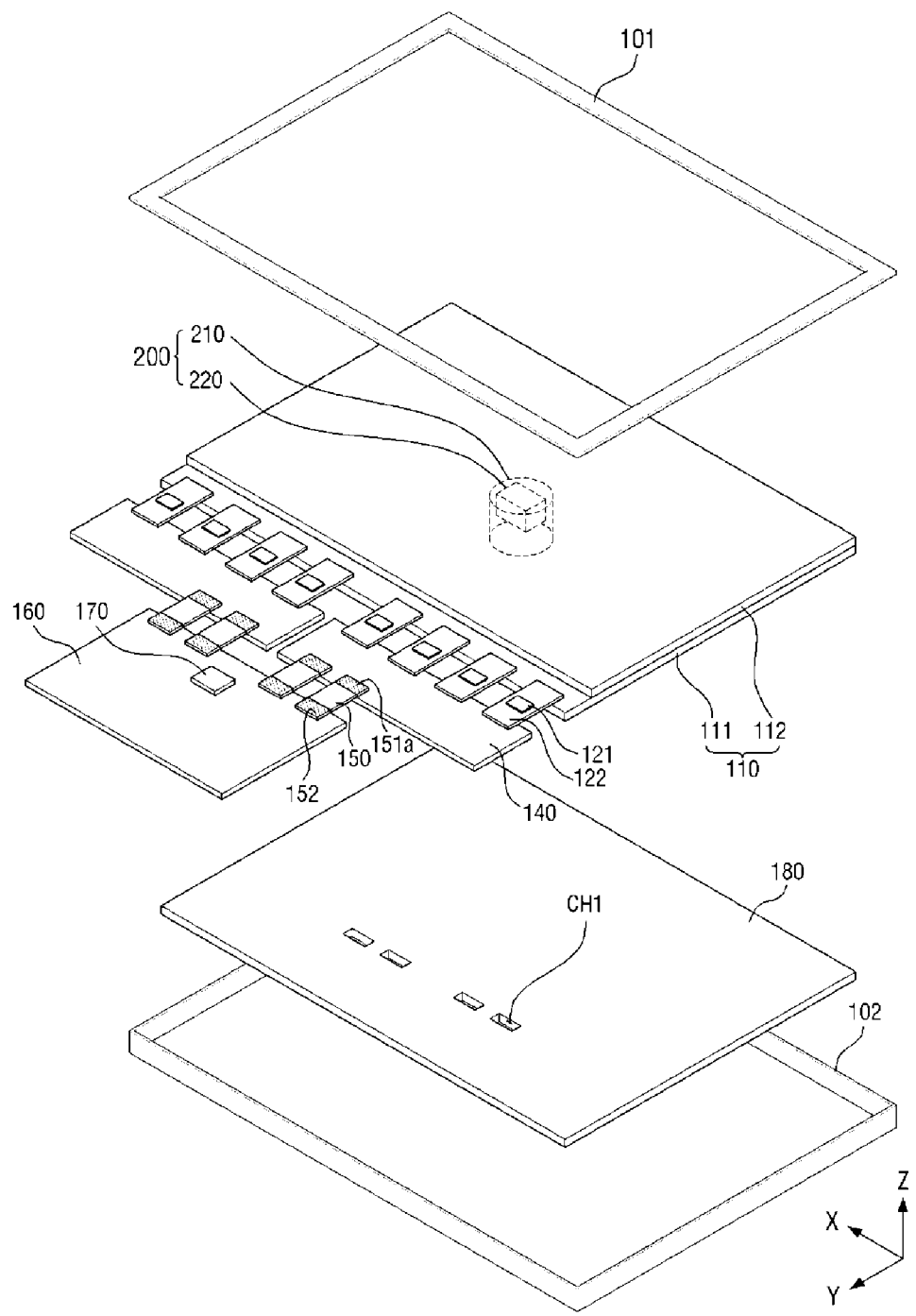
FIG. 2 is an exploded perspective view of a display device according to an embodiment.

FIGS. 1A and 1B are perspective views of a display device according to an embodiment, and FIG. 2 is an exploded perspective view of a display device according to an embodiment.

Referring to FIGS. 1A, 1B, and 2, an embodiment of the display device 10 includes a set cover, a set support 103, a display panel 110, source driving circuits 121, flexible films 122, a heat radiation film 130 (shown in FIG. 4), source circuit boards 140, cables 150, a control circuit board 160, a timing control circuit 170, and a lower cover 180.

Herein, the "on", "over", "top", "upper side", or "upper surface" refers to a direction in which a second substrate 112 is disposed with respect to a first substrate 111 of the display panel 110, that is, the Z-axis direction, and the "beneath", "under", "bottom", "lower side", or "lower surface" refers to a direction in which the heat radiation film 130 is disposed with respect to the first substrate 111 of the display panel 110, that is, a direction opposite to the Z-axis direction. Further, the "left", "right", "upper", and "lower" refer to directions when the display panel 110 is viewed from a plan view, e.g., a top plan view or a plan view in a thickness direction of the display device 10. Herein, the "left" may refer to the X-axis direction, the "right" may refer to a direction opposite to the X-axis direction, the "upper" may refer to the Y-axis direction, and the "lower" may refer to a direction opposite to the Y-axis direction.

The set cover may be disposed to surround the rim or outer edges of the display panel 110. The set cover may cover the non-display area of the display panel 110 and expose the display area of the display panel 110. In an embodiment, the set cover may include an upper set cover 101 and a lower set cover 102 as shown in FIG. 2. The upper set cover 101 may cover the edge of the upper surface of the display panel 110, and the lower set cover 102 may cover the lower surface and side surfaces of the display panel 110. The upper set cover 101 and the lower set cover 102 may be attached to each other by a fixing member such as a screw or an adhesive member such as double-sided tape or adhesive. The upper set cover 101 and the lower set cover 102 may include a plastic or a metal, or a combination thereof.

The set support 103 may be disposed on the lower surface of the lower set cover 102 to support the display device 10 such that the display device 10 is raised. The set support 103 may include a speaker 103a for a woofer which outputs a sound of a low-frequency band. Since the speaker 103a for the woofer may allow the display device 10 to provide not only a sound of a middle-frequency band but also a sound of a low-frequency band, a user may hear a high-quality sound.

The display panel 110 may have a rectangular shape in a plan view. In one embodiment, for example, as shown in FIG. 2, the display panel 110 may have a rectangular shape having long sides in the first direction (X-axis direction) and short sides in the second direction (Y-axis direction). The corner where the long side in the first direction (X-axis direction) meets the short side in the second direction (Y-axis direction) may have a right angle shape or have a round shape with a predetermined curvature. The shape of the display panel 110 in a plan view is not limited to a rectangular shape, and may be variously modified to have another polygonal shape, circular shape, or elliptical shape.

Figure 3:
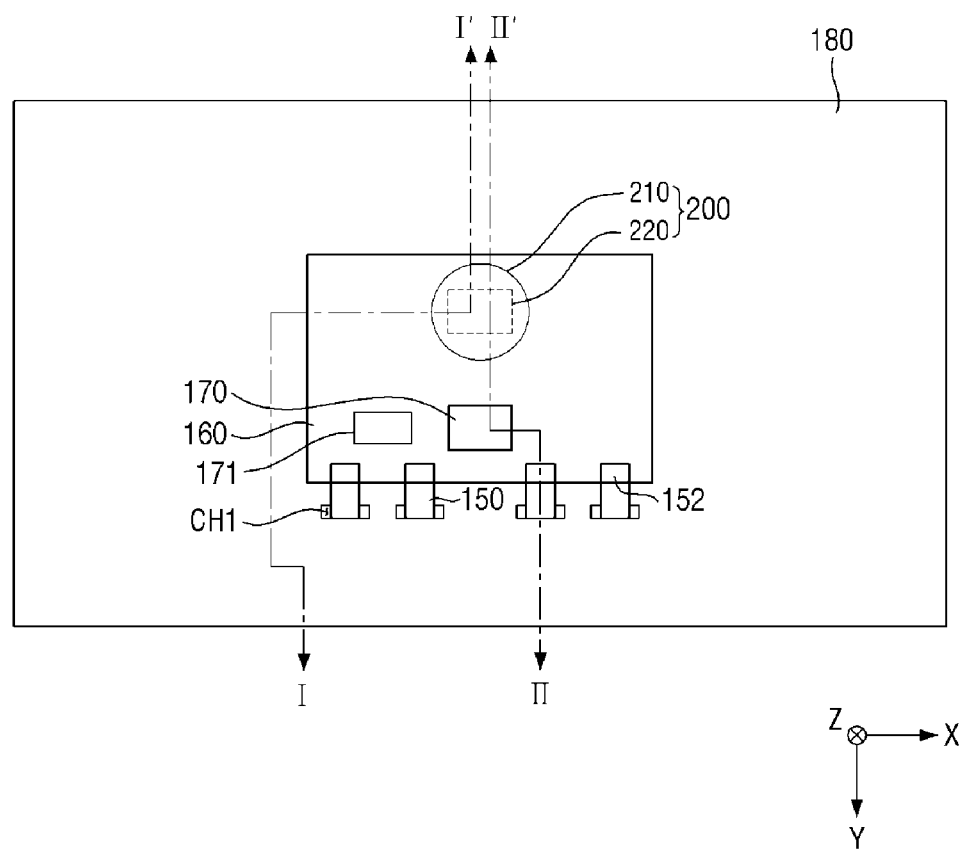
FIG. 3 is a bottom view showing an embodiment of a display device.

In an embodiment, as illustrated in FIG. 3 that the display panel 110 may be flat, but the invention is not limited thereto. The display panel 110 may be bent or bendable with a predetermined curvature.

The display panel 110 may include a first substrate 111 and a second substrate 112. The first substrate 111 and the second substrate 112 may be rigid or flexible. The first substrate 111 may include or be formed of a glass or a plastic. The second substrate 112 may include or be formed of a glass, a plastic, an encapsulation film, or a barrier film. The plastic may be polyethersulphone ("PES"), polyacrylate ("PA"), polyarylate ("PAR"), polyetherimide ("PEI"), polyethylenenapthalate ("PEN"), polyethyleneterepthalate ("PET"), polyphenylenesulfide ("PPS"), polyallylate, polyimide ("PI"), polycarbonate ("PC"), cellulose triacetate ("CAT"), cellulose acetate propionate ("CAP"), or a combination thereof. The encapsulation film or the barrier film may be a film in which a plurality of inorganic films are laminated on one another.

Figure 9:
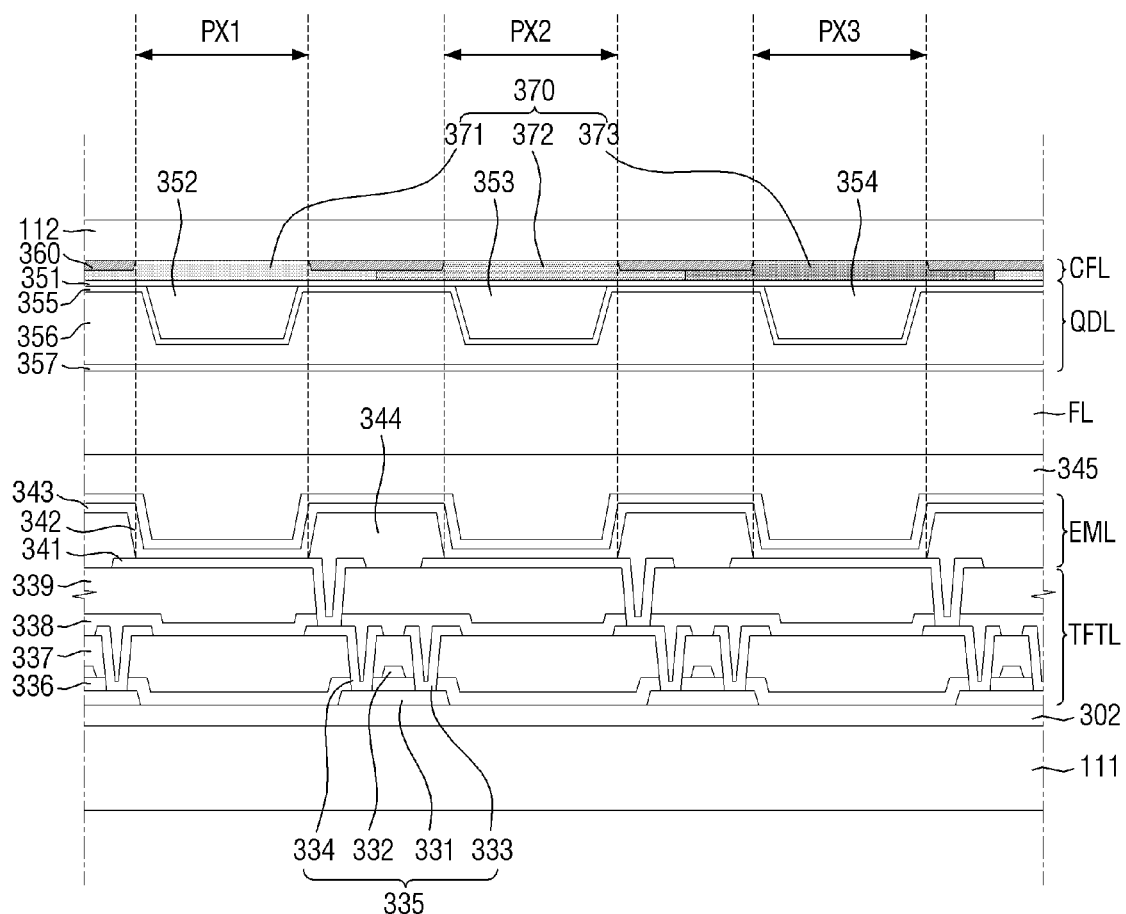
FIG. 9 is a cross-sectional view showing an embodiment of a display area of a display panel.

In an embodiment, the display panel 110 may include a thin film transistor layer TFTL, a light emitting element layer EML, a filler FL, an optical wavelength conversion layer QDL, and a color filter layer CFL, which are disposed between the first substrate 111 and the second substrate 112, as shown in FIG. 9. In such an embodiment, the first substrate 111 may be a thin film transistor substrate on which the thin film transistor layer TFTL, the light emitting element layer EML, and the thin film encapsulation layer TFEL are disposed, the second substrate 112 may a color filter substrate on which the optical wavelength conversion layer QDL and the color filter layer CFL are disposed, and the filler FL may be disposed between the thin film encapsulation layer TFEL of the first substrate 111 and the optical wavelength conversion layer QDL of the second substrate 112. The thin film transistor layer TFTL, light emitting element layer EML, filler FL, optical wavelength conversion layer QDL and color filter layer CFL of the display panel 110 will be described later in greater detail with reference to FIG. 9.

In an embodiment, referring back to FIG. 2, one surface of each of the flexible films 122 may be attached on one surface of the first substrate 111 of the display panel 110, and the other surface thereof may be attached to one surface of the source circuit board 140. Herein, "one surface" or "a first surface" means one of the surfaces parallel to a plane defined by X-axis and Y-axis, and "the other surface" or "a second surface" means the other of the surfaces parallel to a plane defined by X-axis and Y-axis. In an embodiment, the size of the first substrate 111 is larger than that of the second substrate 112, such that one side of the first substrate 111 may be exposed without being covered by the second substrate 112. The flexible films 122 may be attached to one side of the first substrate 111 exposed without being covered by the second substrate 112. Each of the flexible films 122 may be attached to one surface of the first substrate 111 and one surface of the source circuit board 140 using an anisotropic conductive film.

Figure 4:
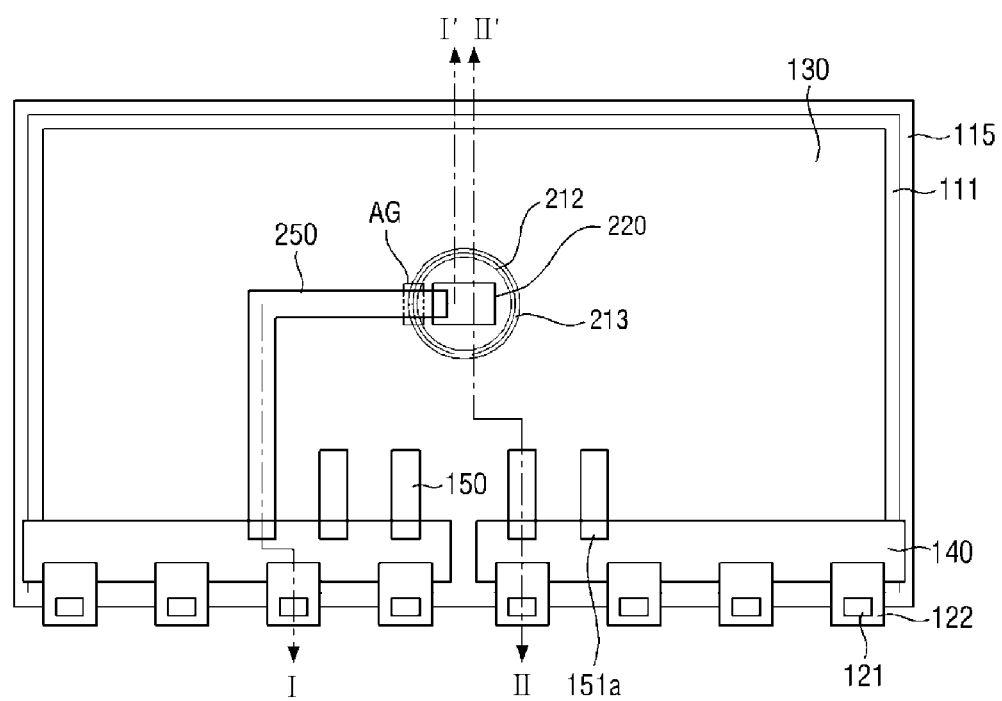
FIG. 4 is a bottom view showing an embodiment of a display device in a state where the lower cover and control circuit board in FIG. 3 are omitted.
Figure 4:
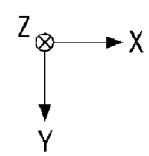

Each of the flexible films 122 may be a tape carrier package or a chip on film. Each of the flexible films 122 may be bendable or in a bent state. In an embodiment, the flexible films 122 may be bent to the lower portion of the first substrate 111 as shown in FIGS. 4 and 6. In such an embodiment, the source circuit boards 140, the cables 150, and the control circuit board 160 may be disposed on the lower surface of the heat radiation film 130.

In an embodiment, as illustrated in FIG. 2, eight flexible films 122 may be attached onto the first substrate 111 of the display panel 110, but the number of flexible films 122 is not limited thereto.

The source driving circuit 121 may be disposed on one surface of each of the flexible films 122. The source driving circuits 121 may be in a form of an integrated circuit ("IC"). Each of the source driving circuits 121 converts digital video data into analog data voltages based on the source control signal of the timing control circuit 170, and supplies the analog data voltages to the data lines of the display panel 110.

Each of the source circuit boards 140 may be connected to the control circuit board 160 through the cables 150. In an embodiment, each of the source circuit boards 140 may include first first connectors 151a for connection to the cables 150. Each of the source circuit boards 140 may be a flexible printed circuit board or a printed circuit board. The cables 150 may be flexible cables.

The control circuit board 160 may be connected to the source circuit boards 140 through the cables 150. In an embodiment, the control circuit board 160 may include second connectors 152 for connection to the cables 150. The control circuit board 160 may be a flexible printed circuit board or a printed circuit board.

In an embodiment, as illustrated in FIG. 2, four cables 150 connect the source circuit boards 140 and the control circuit board 160, but the number of cables 150 is not limited thereto. In an embodiment, as illustrated in FIG. 2, two source circuit boards are provided, but the number of source circuit boards 140 in this specification is not limited thereto.

In an embodiment, where the number of the flexible films 122 is small, the source circuit boards 140 may be omitted, and the flexible films 122 may be directly connected to the control circuit board 160.

The timing control circuit 170 may be disposed on one surface of the control circuit board 160. The timing control circuit 170 may be in a form of an integrated circuit. The timing control circuit 170 may receive digital video data and timing signals from the system-on-chip of a system circuit board, and may generate a source control signal for controlling the timing of the source driving circuits 121 in accordance with the timing signals.

The system-on-chip may be disposed or mounted on a system circuit board that is connected to the control circuit board 160 through another flexible cable, and may be in a form of an integrated circuit. The system-on-chip may be a processor of a smart television ("TV"), a central processing unit ("CPU") or a graphic card of a personal computer ("PC") or a notebook, or an application processor of a smart phone or a tablet PC. The system circuit board may be a flexible printed circuit board or a printed circuit board.

A power supply circuit may be additionally attached to one surface of the control circuit board 160. The power supply circuit may generate voltages used for driving the display panel 110 from a main power source applied from the system circuit board, and may supply the voltages to the display panel 110. In one embodiment, for example, the power supply circuit may generate a high-potential voltage, a low-potential voltage, and an initialization voltage for driving the organic light emitting element, and may supply the generated voltages to the display panel 110. In an embodiment, the power supply circuit may generate and supply driving voltages for driving the source driving circuits 121, the timing control circuit 170, and the like. The power supply circuit may be in a form of an integrated circuit. Alternatively, the power supply circuit may be disposed on another power supply circuit board separately provided from the control circuit board 160. The power circuit board may be a flexible printed circuit board or a printed circuit board.

The heat radiation film 130 may be disposed on one surface of the first substrate 111 that does not face the second substrate 112, that is, on the lower surface of the first substrate 111. In an embodiment, a sound generator 200 may be disposed on one surface of the heat radiation film 130 that does not face the first substrate 111, that is, on the lower surface of the heat radiation film 130. The heat radiation film 130 serves to radiate the heat generated by the sound generator 200. In an embodiment, the heat radiation film 130 may include a graphite layer or a metal layer such as a silver (Ag) layer, a copper (Cu) layer or an aluminum (Al) layer, which have high thermal conductivity.

In an embodiment, the heat radiation film 130 may include a plurality of graphite layers or a plurality of metal layers, each layers being on a plane defined by the first direction (X-axis direction) and the second direction (Y-axis direction). In such an embodiment, since the heat generated by the sound generator 200 may be diffused in the first direction (X-axis direction) and the second direction (Y-axis direction), the heat may be discharged more effectively. Herein, the first direction (X-axis direction) may be a width direction (or horizontal direction) of the display panel 110, the second direction (Y-axis direction) may be a height direction (or vertical direction) of the display panel 110, and the third direction (Z-axis direction) may be a thickness direction of the display panel 110. Therefore, the influence of the heat generated by the sound generator 200 on the display panel 110 may be minimized due to the heat radiation film 130.

In an embodiment, the thickness D1 of the heat radiation film 130 may be thicker than the thickness D2 of the first substrate 111 and the thickness D3 of the second substrate 112 to prevent the heat generated by the sound generator 200 from influencing the display panel 110.

The size of the heat radiation film 130 may be smaller than that of the first substrate 111, and thus an edge portion of one surface of the first substrate 111 may be exposed without being covered by the heat radiation film 130.

In an embodiment, the sound generator 200 may be a vibration generator capable of vibrating the display panel 110 in the third direction (Z-axis direction). In such an embodiment, the display panel 110 may serve as a diaphragm for outputting a sound.

Figure 10:
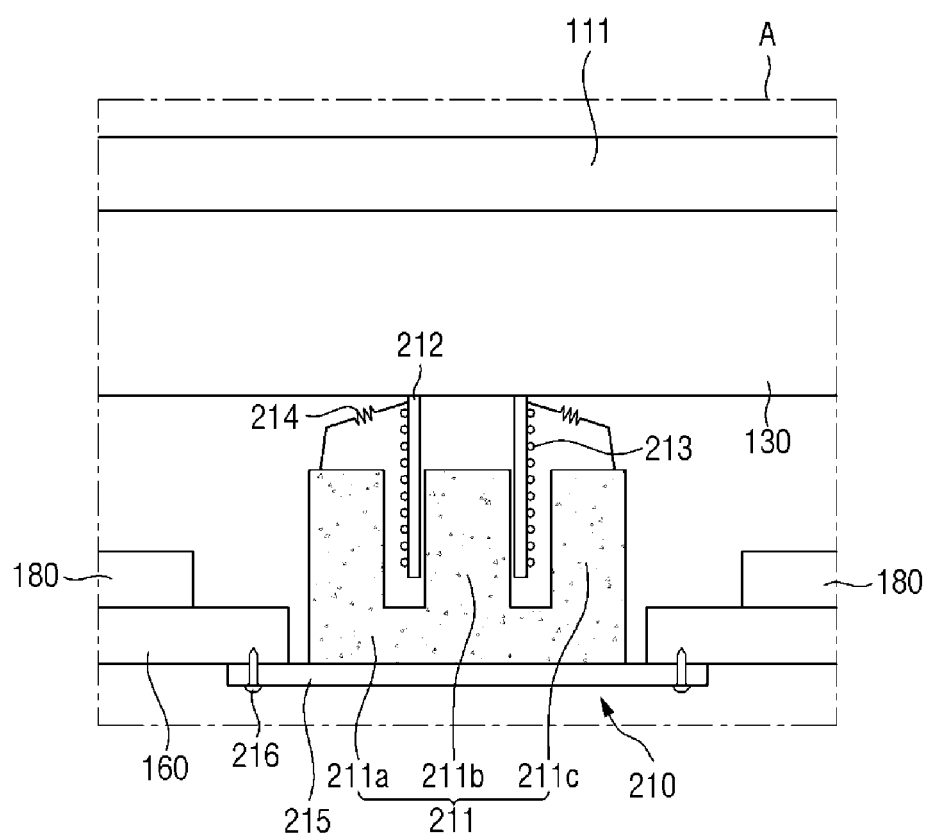
FIG. 10 is a cross-sectional view showing an embodiment of a first vibration generator.
Figure 11A:
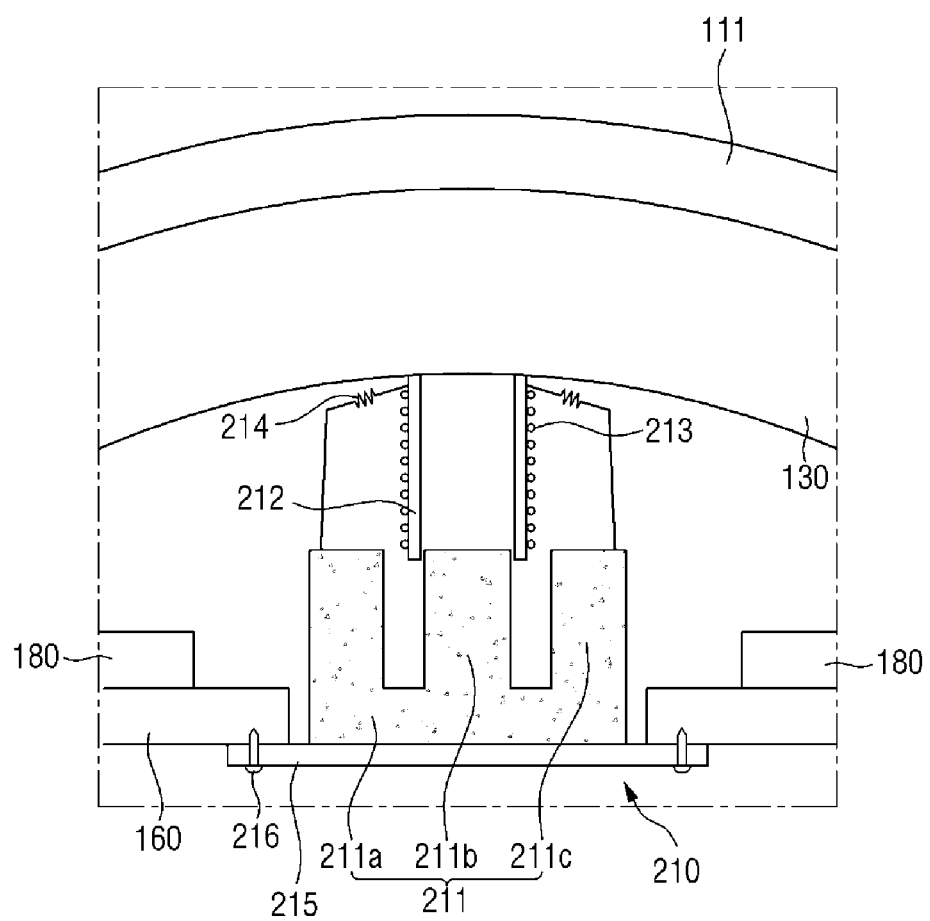
FIGS. 11A and 11B are views showing an embodiment of the vibration of a display panel by the first vibration generator shown in FIG. 10.
Figure 11B:
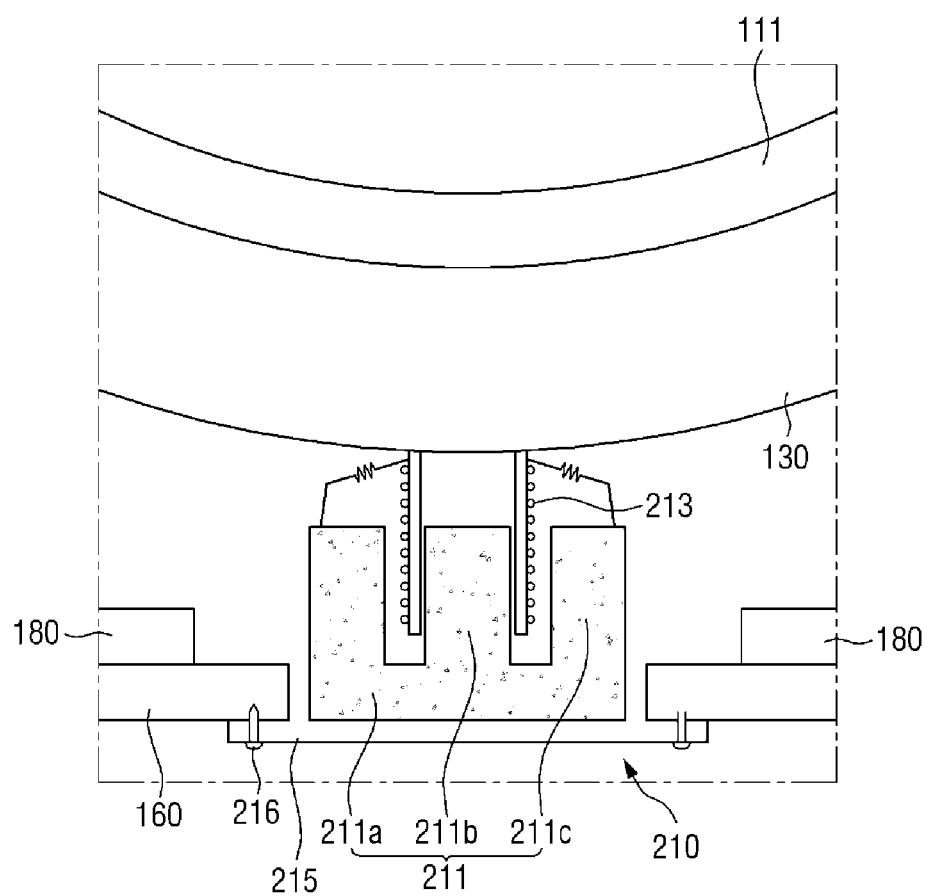

In an embodiment, the sound generator 200 may include a first vibration generator 210 which may function as an exciter for vibrating the display panel 110 by generating a magnetic force using a first voice coil as shown in FIGS. 10, 11A, and 11B, and a second vibration generator 220 having a piezoelectric element that contracts and expands according to a voltage applied thereto to vibrate the display panel 110 as shown in FIGS. 12, 13, and 14A to 14C.

In an embodiment, the first vibration generator 210 may serve as a middle sound generator for outputting a sound of a middle frequency band, and the second vibration generator 220 may serve as a high sound generator for outputting a sound of a high frequency band. In such an embodiment, the display device 10 may provide a sound of a high frequency band, which may not be effectively provided by the first vibration generator 210, by using the second vibration generator 220, and may provide a sound of a middle frequency band, which may not be effectively provided by the second vibration generator 220, by using the first vibration generator 210. Therefore, the display device 10 provides sounds of middle and high frequency bands through the sound generator 200 including the first vibration generator 210 and the second vibration generator 220, and provides a sound of a low frequency band through a speaker 103a for a woofer, thereby allowing a user to hear a high-quality sound.

In an embodiment, as illustrated in FIG. 2, the display device 10 may include a single sound generator 200, but the number of the sound generator 200 is not limited thereto. Alternatively, a plurality of sound generators 200 may be provided, and thus the display device 10 may provide a stereo sound.

The lower cover 180 may be disposed on one surface of the heat radiation film 130. The lower cover 180 may be attached to the edge of one surface of the first substrate 111 of the display panel 110 through a first adhesive member 115. The first adhesive member 115 may be a double-sided tape including a buffer layer such as a foam. The lower cover 180 may include or be made of a metal or reinforced glass.

As described above, in an embodiment of the display device 10, as shown in FIGS. 1 and 2, the sound generator 200 may output a sound by using the display panel 110 as a diaphragm, and thus the sound may be output in the front direction of the display device, thereby improving sound quality. In such an embodiment, a separate speaker disposed on the lower surface or one side of a conventional display panel may be omitted by including the sound generator.

In an embodiment, as illustrated in FIGS. 1 and 2, the display device 10 may be a middle- or large-sized display device including a plurality of source driving circuits 121, but the invention is not limited thereto. Alternatively, the display device 10 may be a small-sized display device including a single source driving circuit 121. In such an embodiment, the flexible films 122, the source circuit boards 140, and the cables 150 may be omitted. In such an embodiment, the source driving circuit 121 and the timing control circuit 170 may be integrated into a single integrated circuit to be attached onto a single flexible circuit board, or may be attached onto the first substrate 111 of the display panel 110. In an embodiment, where the display device 10 is a middle- and large-sized display device, the display device 10 may be a monitor or a TV, for example. In an embodiment, where the display device 10 is a small-sized display device, the display device 10 may be a smart phone or a table PC, for example.

Figure 5:
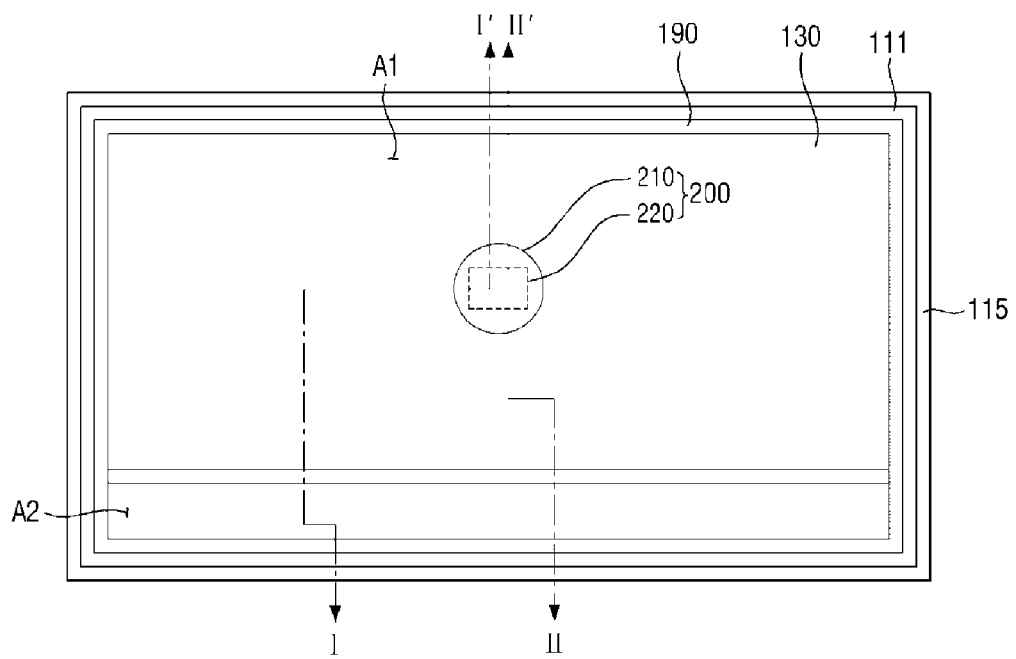
FIG. 5 is a bottom view showing an embodiment of the arrangement of a radio wave blocking member and a sound generator.
Figure 6A:
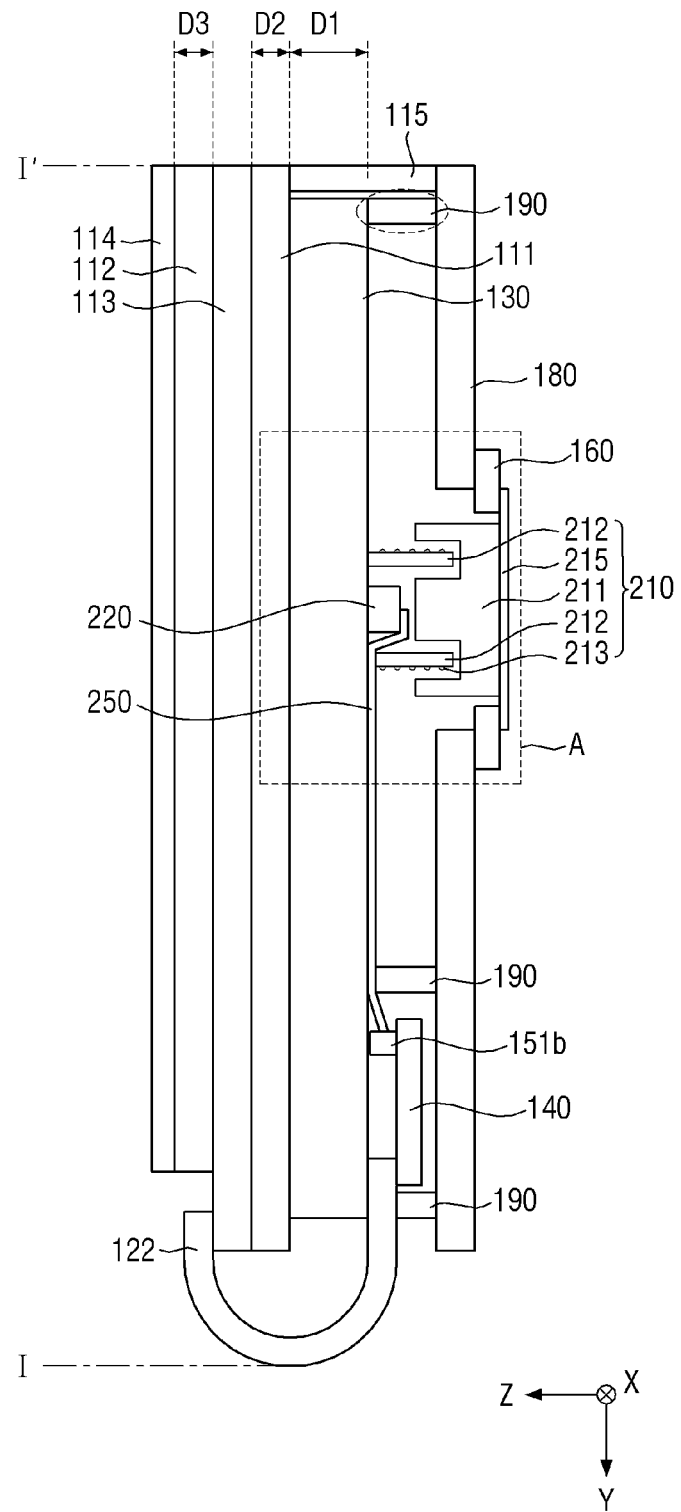
FIG. 6A is a cross-sectional view taken along I-I' of FIGS. 3 to 5.
Figure 6B:
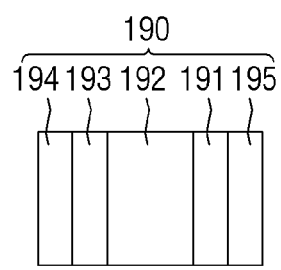
FIG. 6B is an enlarged view of the encircled portion of FIG. 6A.
Figure 7:
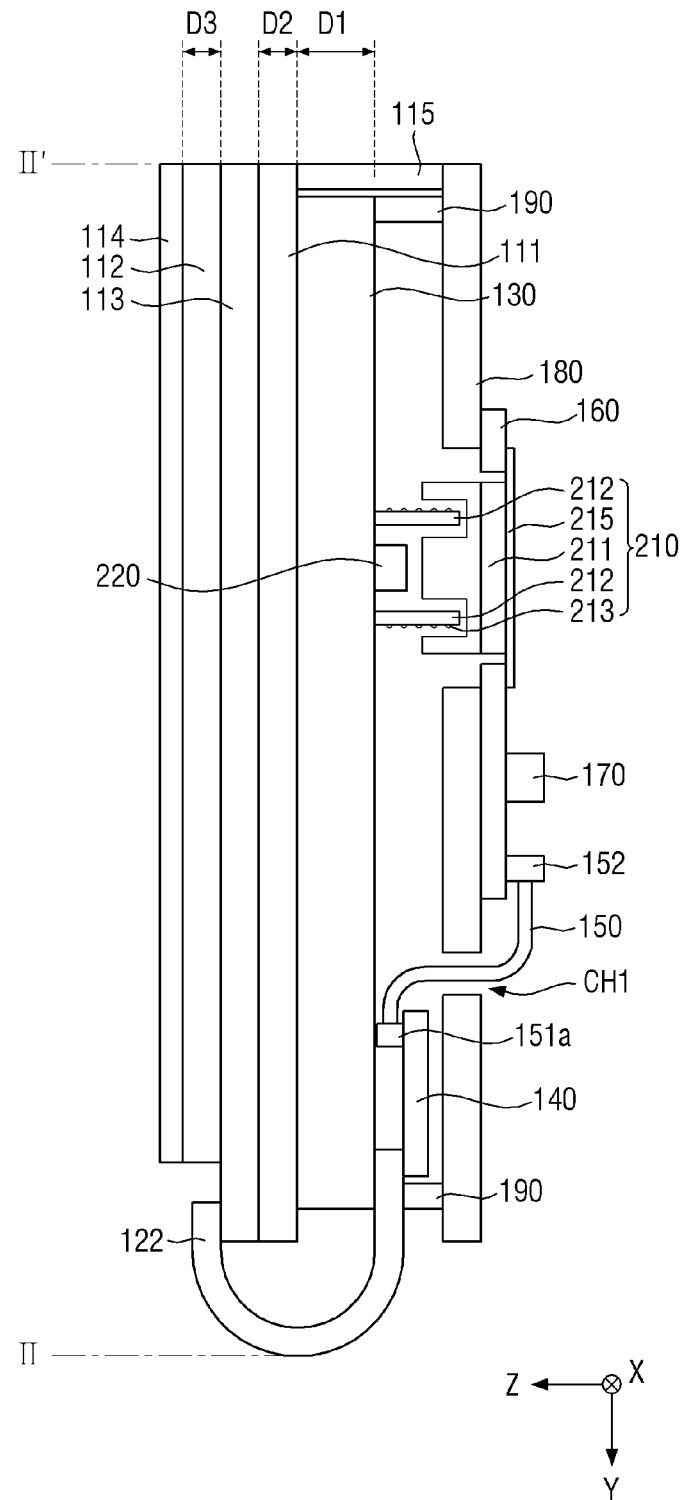
FIG. 7 is a cross-sectional view taken along II-II' of FIGS. 3 to 5.

FIG. 3 is a bottom view showing an embodiment of a display device, FIG. 4 is a bottom view showing an embodiment of a display device in a state where the lower cover and control circuit board in FIG. 3 are omitted, FIG. 5 is a bottom view showing an embodiment of the arrangement of a radio wave blocking member and a sound generator, FIG. 6A is a cross-sectional view taken along I-I' of FIGS. 3 to 5, FIG. 6B is an enlarged view of the encircled portion of FIG. 6A, and FIG. 7 is a cross-sectional view taken along of FIGS. 3 to 5.

For convenience of explanation, FIG. 5 shows only the first substrate 111 of the display panel 110, the first adhesive member 115, the heat radiation film 130, the radio wave blocking member 190, and the first and second vibration generators 210 and 220. In FIG. 5, the source driver circuits 121, the flexible films 122, the source circuit boards 140, the cables 150, the control circuit board 160, the timing control circuit 170, and the lower cover 180 are omitted for convenience of illustration.

Referring to FIGS. 3 to 7, the flexible films 122 are bent to the lower side of the heat radiation film 130, and thus the source circuit board 140 may be disposed on one surface of the heat radiation film 130.

The control circuit board 160 is disposed on one surface of the lower cover 180, and the source circuit board 140 is disposed on one surface of the heat radiation film 130. In an embodiment, the source circuit board 140 is disposed between one surface of the heat radiation film 130 and the other surface of the lower cover 180. The cable 150 connected to the first first connector 151a of the source circuit board 140 may be connected to the second connector 151 of the control circuit board 160 through a first cable hole CH1 defined through the lower cover 180. When viewed from a plan view, the first cable hole CH1 may be disposed between the control circuit board 160 and the source circuit board 140.

In an embodiment, as shown in FIGS. 6A and 7, the first vibration generator 210 may include a first magnet 211, a bobbin 212, a first voice coil 213, and a lower plate 215. The bobbin 212 may be attached to one surface of the heat radiation film 130 by an adhesive member such as a double-sided adhesive. The first voice coil 213 may be wound (or rolled) on the outer peripheral surface of the bobbin 212. Since the bobbin 212 is formed to have a cylindrical shape, a central protrusion of the first magnet 211 is disposed inside the bobbin 212, and the side wall of the first magnet 211 may be disposed outside the bobbin 212. The lower plate 215 may be disposed on the lower surface of the first magnet 211. Thus, the lower plate 215 may be fixed to one surface of the control circuit board 160 through a fixing member 216 such as a screw.

In an embodiment, the first magnet 211 may be disposed in a hole formed or defined in the control circuit board 160 and a hole formed or defined in the lower cover 180. Since the control circuit board 160 is fixed to one surface of the lower cover 180 through a fixing member such as a screw, the hole of the control circuit board 160 may be smaller than the hole of the lower cover 180.

The bobbin 212 of the first vibration generator 210 is fixed to one surface of the heat radiation film 130, and the first magnet 211 is fixed to the control circuit board 160. In such an embodiment, the control circuit board 160 is provided with holes smaller than the lower plate 215 but larger than the first magnet 211. Therefore, the bobbin 212 wound with the voice coil 213 may reciprocate in the third direction (Z-axis direction) according to the magnetic field generated around the first voice coil 213. The first vibration generator 210 will be described later in greater detail with reference to FIGS. 10, 11A, and 11B.

The second vibration generator 220 may be attached to one surface of the heat radiation film 130 by an adhesive member such as a double-sided adhesive. The second vibration generator 220 may be connected to a second first connector 151b of the source circuit board 140 by the sound circuit board 250. A first pad and a second pad, which are connected to the first electrode and second electrode disposed on one surface of the second vibration generator 220, may be disposed on one side of the second vibration generator 220. A connection portion for connecting to the second first connector 151b of the source circuit board 140 may be disposed on another side of the sound circuit board 250. In such an embodiment, the second vibration generator 220 may be electrically connected to the source circuit board 140 by the sound circuit board 250. The sound circuit board 250 may be a flexible printed circuit board or a flexible cable.

In an embodiment, the first vibration generator 210 and second vibration generator 220 of the sound generator 200 are arranged to overlap each other in the thickness direction of the display panel 110, that is, in the third direction (Z-axis direction), such that the first vibration generator 210 and the second vibration generator 220 simultaneously vibrate the display panel 110 to output a sound. In such an embodiment, the first vibration generator 210 and the second vibration generator 220 simultaneously vibrate a same vibration surface to output a sound. In such an embodiment, the first vibration generator 210 and the second vibration generator 220 may vibrate the display panel 110 by distributing a sound band. The first vibration generator 210 may vibrate the display panel 110 to output a high frequency sound, and the second vibration generator 220 may vibrate the display panel 110 to output a middle frequency sound. Thus, the sound generator 200 may provide a high-quality sound having both middle and high frequency bands.

In an embodiment, the bobbin 212 of the first vibration generator 210 may be in a cylindrical shape, and the second vibration generator 220 may be disposed inside the bobbin 212 to be surrounded by the bobbin 212. In such an embodiment, as shown in FIG. 6A, the sound circuit board 250 may be disposed between the heat radiation film 130 and the bobbin 212 of the first vibration generator 210 to allow the sound circuit board 250 to be electrically connected to the second vibration generator 220. In such an embodiment, the bobbin 212 may be disposed on the sound circuit board 250, and the bobbin 212 may be in contact with one surface of the sound circuit board 250.

Figure 8:
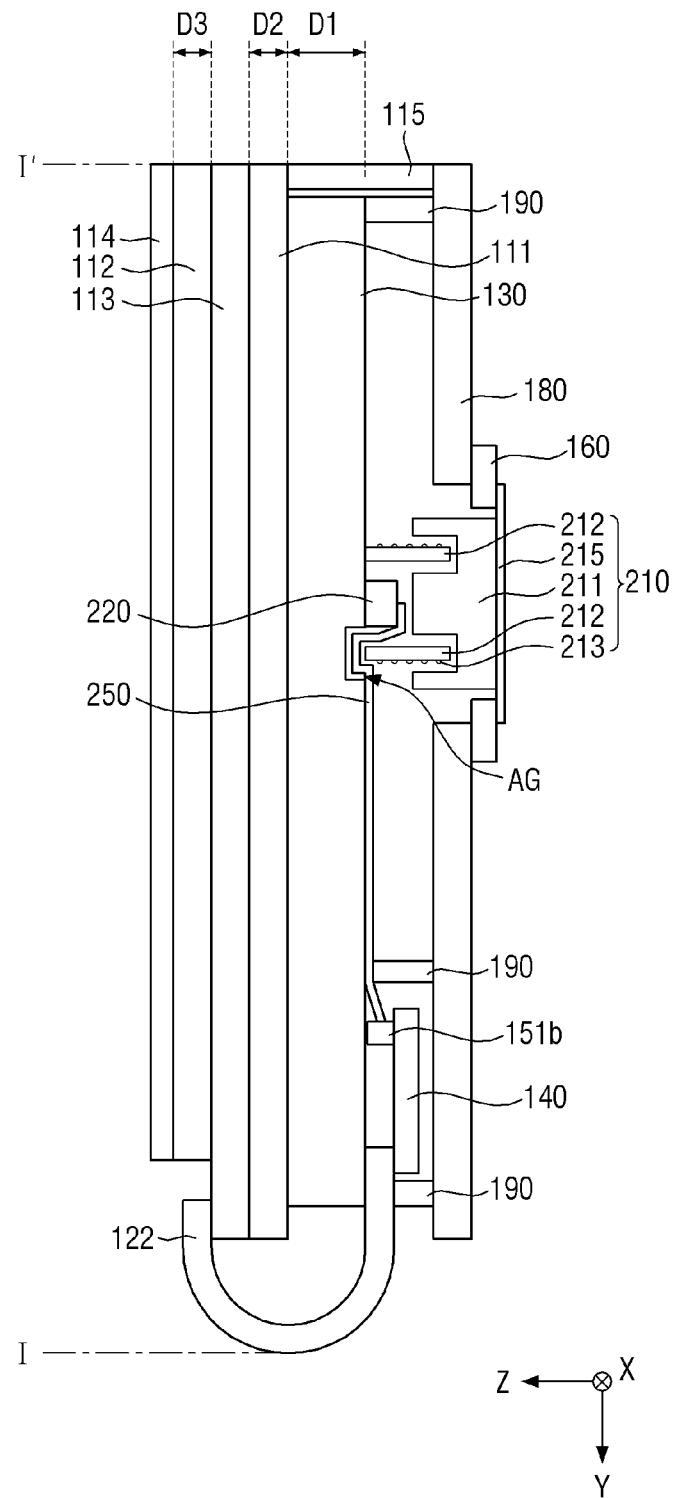
FIG. 8 is another cross-sectional view taken along I-I' of FIGS. 3 to 5 according to an alternative embodiment.

Alternatively, as shown in FIG. 8, the sound circuit board 250 may be disposed in an accommodation groove AG formed or defined in the heat radiation film 130. The accommodation groove AG of the heat radiation film 130 may be a groove formed by removing a part of one surface of the heat radiation film 130. The height of the accommodation groove AG of the heat radiation film 130 may be greater than the thickness of the sound circuit board 250. The accommodation groove AG of the heat radiation film 130 may overlap a part of the bobbin 212 of the first vibration generator 210 as shown in FIG. 4. Therefore, the adhesion force between the bobbin 212 of the first vibration generator 210 and one surface of the heat radiation film 130 may not be substantially reduced, and the sound circuit board 250 may not be pressed by the bobbin 212, such that the sound circuit board 250 may be stably electrically connected to the first vibration generator 210.

The control circuit board 160 may be provided thereon with not only the timing control circuit 170 but also the sound driving circuit 171 as shown in FIG. 3. The sound driving circuit 171 may receive a sound control signal as a digital signal from the system circuit board. The sound driving circuit 171 may be in a form of an integrated circuit and disposed on the control circuit board 160 or the system board.

The sound driving circuit 171 may include a digital signal processor ("DSP") for processing a sound control signal as a digital signal, a digital-analog converter ("DAC") for converting the digital signal processed from the DSP into driving voltages as an analog signal, and an amplifier ("AMP") for amplifying and outputting the analog driving voltages converted from the DAC. The analog driving voltages may include a positive driving voltage and a negative driving voltage.

The sound driving circuit 171 may generate a first sound signal including first first and second first signals for driving the first vibration generator 210 based on a sound control signal, and may generate a second sound signal including first second and second second signals for driving the second vibration generator 220 based on the sound control signal.

The first vibration generator 210 may receive a first sound signal including the first first driving voltage and the second first driving voltage from the sound driving circuit 171. The first vibration generator 210 may output a sound by vibrating the display panel 110 according to the first first driving voltage and the second first driving voltage. In an embodiment, as shown in FIGS. 6 and 7, where the sound driving circuit 171 and the lower plate 215 of the first vibration generator 210 are disposed on the control circuit board 160, the sound driving circuit 171 and the first voice coil 213 of the first vibration generator 210 may be electrically connected through the metal lines of the control circuit board 160.

The second vibration generator 220 may receive a second sound signal including the first second driving voltage and the second second driving voltage from the sound driving circuit 171. The second vibration generator 220 may output a sound by vibrating the display panel 110 based on the first second driving voltage and the second second driving voltage.

In an embodiment, as shown in FIG. 3, the sound driving circuit 171 may be disposed on the control circuit board 160, and the second vibration generator 220 may be disposed on one surface of the heat radiation film 130. In such an embodiment, the second sound signal of the sound driving circuit 171 may be transmitted to the second vibration generator 220 through the cable 150, the source circuit board 140, and the sound circuit board 250.

In an embodiment, as shown in FIG. 5, the size of the heat radiation film 130 may be smaller than that of the first substrate 111, and thus the four edges of one surface of the first substrate 111 may be exposed without being covered by the heat radiation film 130.

The first adhesive member 115 may be disposed on the four edges of one surface of the first substrate 111 exposed without being covered by the heat radiation film 130. In an embodiment, as shown in FIG. 5, the first adhesive member 115 may attach one surface of the first substrate 111 to the other surface of the lower cover 180. The first adhesive member 115 may be a double-sided tape including a buffer layer such as foam.

The radio wave blocking member 190 may be disposed on the four edges of the heat radiation film 130. In an embodiment, as shown in FIGS. 6 and 7, the radio wave blocking member 190 may be attached to one surface of the heat radiation film 130 and the other surface of the lower cover 180.

In an embodiment, the radio wave blocking member 190 may be disposed on the sound circuit board 250, and in such an embodiment, one surface of the sound circuit board 250 may be attached to the other surface of the lower cover 180. In an embodiment, the radio wave blocking member 190 may be disposed on the flexible film 122, and in such an embodiment, one surface of the flexible film 122 may be attached to the other surface of the lower cover 180. Since the radio wave blocking member 190 includes a buffer layer 192 as shown in FIG. 6B, the thickness (or a height in the Z-axis direction) of the radio wave blocking member 190 may vary as shown in FIG. 6A depending on the thickness of the sound circuit board 250 and the thickness of the flexible film 122. In one embodiment, for example, since the thickness of the acoustic circuit board 250 is thinner than the thickness of the flexible film 122, the thickness of the radio wave blocking member 190 disposed on the sound circuit board 250 may be thicker than the thickness of the radio wave blocking member 190 disposed on the flexible film 122. In such an embodiment, the thickness of the radio wave blocking member 190 attached to one surface of the heat radiation film 130 and the other surface of the lower cover 180 may be thicker than the thickness of the radio wave blocking member 190 disposed on the sound circuit board 250.

In an embodiment, as shown in FIG. 6B, the radio wave blocking member 190 may include a base film 191, a buffer layer 192, a sacrificial layer 193, a first adhesive layer 194, and a second adhesive layer 195.

The base film 191 may include or be formed of a plastic. In one embodiment, for example, the base film 191 may include or be formed of PET, but the material thereof is not limited thereto.

The buffer layer 192 may be disposed on one surface of the base film 191. The buffer layer 192 may include or be formed of a foam having elasticity. In one embodiment, for example, the buffer layer 192 may include or be formed of polyurethane, silicone, rubber, or aerogel, but the material thereof is not limited thereto.

The sacrificial layer 193 may be disposed on one surface of the buffer layer 192. The sacrificial layer 193 may function as a layer to be separated in a case where the radio wave blocking member 190 is desired to be detached when the radio wave blocking member 190 is erroneously attached. In such an embodiment, a part of the first adhesive layer 194 and a part of the sacrificial layer 193 may remain on the other surface of the lower cover 180. The sacrificial layer 193 may include or be formed of a material having low elasticity. In one embodiment, for example, the sacrificial layer 193 may include or be formed of polyurethane, but the material thereof is not limited thereto. Alternatively, the sacrificial layer 193 may be omitted.

The first adhesive layer 194 may be disposed on one surface of the sacrificial layer 193. The first adhesive layer 194 may be attached to the other surface of the lower cover 180. The second adhesive layer 195 may be disposed on the other surface of the second base film 201. The second adhesive layer 195 may be attached to one surface of the heat radiation film 130. The first adhesive layer 194 and the second adhesive layer 195 may be an acrylic adhesive or a silicone adhesive, but are not limited thereto.

In an embodiment, as shown in FIG. 5, one surface of the heat radiation film 130 may be divided into a first area A1 and a second area A2 by the radio wave blocking member 190.

In such an embodiment, the first area A1, which is an area where the sound generator 200 is disposed, may be defined by the radio wave blocking member 190 disposed to surround the sound generator 200. The second area A2, which is an area where the source circuit boards 140 are arranged, may be defined by the radio wave blocking member 190 disposed to surround the source circuit boards 140. In such an embodiment, where the second area A2 is defined as described above, the source circuit boards 140, the source driving circuits 121 and the flexible films 122 may be effectively prevented from being influenced by the vibration of the sound generator 200 of the first to fourth areas A1 to A4 or the influence by the vibration of the sound generator 200 of the first to fourth areas A1 to A4 may be substantially reduced.

According to an embodiment, as shown in FIGS. 3 to 7, the first vibration generator 210 and second vibration generator 220 of the sound generator 200 are disposed to overlap each other in the thickness direction of the display panel 110, that is, in the third direction (Z-axis direction), and thus the first vibration generator 210 and the second vibration generator 220 may simultaneously vibrate the display panel 110 to output a sound. Accordingly, the first vibration generator 210 and the second vibration generator 220 may vibrate the display panel 110 by distributing a sound band, and thus the sound generator 200 may provide a high-quality sound having both middle and high frequency bands.

In an embodiment, the sound circuit board 250 may be disposed between the heat radiation film 130 and the bobbin 212 of the first vibration generator 210 or may be disposed in the accommodation groove AG of the heat radiation film 130. Accordingly, even when the second vibration generator 220 is surrounded by the bobbin 212 of the first vibration generator 210, the sound circuit board 250 may electrically connect the second vibration generator 220 and the source circuit board 140.

In an embodiment, since the second vibration generator 220 and the source circuit board 140 are connected through the sound circuit board 250 and the cable 150 connected to the source circuit board 140 is connected to the control circuit board 160 through the first cable hole CH1 defined through the lower cover 180, the control circuit board 160 and the second vibration generator 220 may be easily electrically connected even when the second vibration generator 220 is disposed on one surface of the heat radiation film 130 and the control circuit board 160 is disposed on one surface of the lower cover 180.

In such an embodiment, since the sound generator 200 is surrounded by the radio wave blocking member 190, the vibration of the display panel 110 generated by the sound generator 200 is effectively prevented from influencing the source circuit boards 140.

FIG. 9 is a cross-sectional view showing an embodiment of a display area of a display panel.

Referring to FIG. 9, the display panel 110 may include a first substrate 111, a second substrate 112, a thin film transistor layer TFTL, a light emitting element layer EML, a filler FL, an optical wavelength conversion layer QDL, and a color filter layer CFL. In an embodiment, the layers between the first substrate 111 and the second substrate 112, e.g., the thin film transistor layer TFTL, the light emitting element layer EML, the filler FL, the optical wavelength conversion layer QDL, and the color filter layer CFL, may define the layer indicated by the reference number 113 in FIGS. 6A, 7 and 8. In FIGS. 6A, 7 and 8, the layer indicated by the reference number 114 may be a panel or layer on the display panel 110, e.g., a touch sensing panel or layer. Alternately, the layer indicated by the reference number 114 may be a polarizing film including a linear polarizer and a phase retardation film such as a quarter-wave plate.

In such an embodiment, a buffer film 302 may be disposed on one surface of the first substrate 111 facing the second substrate 112. The buffer film 302 may be disposed on the first substrate 111 to protect the thin film transistors 335 and the light emitting elements from moisture entering into the first substrate 111 that is vulnerable to moisture permeation. The buffer film 302 may include or be formed of a plurality of alternately laminated inorganic films. In one embodiment, for example, the buffer film 302 may be a multilayer film in which one or more inorganic films of a silicon oxide film (SiOx), a silicon nitride film (SiNx), and a SiON film are alternately laminated. Alternatively, the buffer film may be omitted.

The thin film transistor layer TFTL is disposed on the buffer film 302. The thin film transistor layer TFTL includes a thin film transistor 335, a gate insulating film 336, an interlayer insulating film 337, a protective film 338, and a planarization film 339.

The thin film transistor 335 is disposed on the buffer film 302. The thin film transistor 335 includes an active layer 331, a gate electrode 332, a source electrode 333, and a drain electrode 334. In an embodiment, as illustrated in FIG. 9, the thin film transistor 335 may be formed in a top gate manner in which the gate electrode 332 is located over the active layer 331, but the invention is not limited thereto. Alternatively, the thin film transistors 335 may be formed in a bottom gate manner in which the gate electrode 332 is located under the active layer 331 or in a double gate manner in which the gate electrode 332 is located both over and under the active layer 331.

The active layer 331 is disposed on the buffer film 302. The active layer 331 may include or be formed of a silicon-based semiconductor material or an oxide-based semiconductor material. A light blocking layer for blocking external light incident on the active layer 331 may be disposed between the buffer film and the active layer 331.

The gate insulating film 336 may be disposed on the active layer 331. The gate insulating film 316 may include or be formed of an inorganic film, for example, a silicon oxide film (SiOx), a silicon nitride film (SiNx), or a multilayer film thereof.

The gate electrode 332 and the gate line may be disposed on the gate insulating film 316. The gate electrode 332 and the gate line may include or be formed of a single layer or multiple layers, each layer including at least one of molybdenum (Mo), aluminum (Al), chromium (Cr), gold (Au), titanium (Ti), nickel (Ni), neodymium (Nd), and copper (Cu), or an alloy thereof.

The interlayer insulating film 337 may be disposed on the gate electrode 332 and the gate line. The interlayer insulating film 337 may include or be formed of an inorganic film, for example, a silicon oxide film (SiOx), a silicon nitride film (SiNx), or a multilayer film thereof.

The source electrode 333, the drain electrode 334, and the data line may be disposed on the interlayer insulating film 337. Each of the source electrode 333 and the drain electrode 334 may be connected to the active layer 331 through a contact hole defined through the gate insulating film 336 and the interlayer insulating film 337. The source electrode 333, the drain electrode 334, and the data line may include or be formed of a single layer or multiple layers, each layer including at least one of molybdenum (Mo), aluminum (Al), chromium (Cr), gold (Au), titanium (Ti), nickel (Ni), neodymium (Nd), and copper (Cu), or an alloy thereof.

The protective film 338 for insulating the thin film transistor 335 may be disposed on the source electrode 333, the drain electrode 334, and the data line. The protective film 338 may include or be formed of an inorganic film, for example, a silicon oxide film (SiOx), a silicon nitride film (SiNx), or a multilayer film thereof.

The planarization film 339 may be disposed on the protective film 338 to planarize a step due to the thin film transistor 335. The planarization film 339 may include or be formed of an organic film including an acryl resin, an epoxy resin, a phenolic resin, a polyamide resin, or a polyimide resin.

The light emitting element layer EML is disposed on the thin film transistor layer TFTL. The light emitting element layer EML includes light emitting elements and a pixel defining film 344.

The light emitting elements and the pixel defining film 344 are disposed on the planarization film 339. The light emitting element may be an organic light emitting element. In an embodiment, the light emitting element may include an anode electrode 341, light emitting layers 342, and a cathode electrode 343.

The anode electrode 341 may be disposed on the planarization film 339. The anode electrode 341 may be connected to the source electrode 333 of the thin film transistor 335 through a contact hole defined through the protective film 338 and the planarization film 339.

The pixel defining film 344, which defines pixels, may be disposed on the planarization film 339 to cover the edges of the anode electrode 341. In an embodiment, the pixel defining film 344 serves to define sub-pixels PX1, PX2, and PX3. Each of the sub-pixels PX1, PX2 and PX3 has a structure in which the anode electrode 341, the light emitting layer 342, and the cathode electrode 343 are sequentially laminated, and thus holes from the anode electrode 341 and electrons from the cathode electrode 343 are combined with each other in the light emitting layer 342 to emit light.

The light emitting layers 342 are disposed on the anode electrode 341 and the pixel defining film 344. The light emitting layer 342 may be an organic light emitting layer. The light emitting layer 342 may emit light having a short wavelength such as a blue light or a ultraviolet light. The peak wavelength range of the blue light may be about 450 nanometers (nm) to 490 nm, and the peak wavelength range of ultraviolet light may be less than 450 nm. In an embodiment, the light emitting layer 342 may be a common layer formed commonly to the sub-pixels PX1, PX2, and PX3. In such an embodiment, the display panel 110 may include an optical wavelength conversion layer (not shown) for converting light of a short wavelength such as the blue light or the ultraviolet light emitted from the light emitting layer 342 into a red light, a green light and a blue light, and a color filter layer CFL for transmitting the red light, the green light and the blue light.

The light emitting layer 342 may include a hole transporting layer, a light emitting layer, and an electron transporting layer. In an embodiment, the light emitting layer 342 may be formed in a tandem structure of two stacks or more, and in such an embodiment, a charge generating layer may be disposed between the stacks.

The cathode electrode 343 is disposed on the light emitting layer 342. The cathode electrode 343 may be disposed to cover the light emitting layer 342. The cathode electrode 343 may be a common layer provided commonly in entire pixels.

The light emitting element layer EML is formed by a top emission manner in which light is emitted in a direction toward the second substrate 112, that is, in an upward direction. In an embodiment, the anode electrode 341 may include or be formed of a high-reflectance metal material such as a laminate structure (Ti/Al/Ti) of aluminum and titanium, a laminate structure (ITO/Al/ITO) of aluminum and indium in oxide ("ITO"), an APC alloy, or a laminate structure (ITO/APC/ITO) of an APC alloy and ITO. The APC alloy may be an alloy of silver (Ag), palladium (Pd), and copper alloy (Cu). The cathode electrode 263 may include or be formed of a transparent conductive material ("TCO") such as ITO or indium zinc oxide ("IZO"), which is light-transmissive, or a semi-transmissive conductive material such as magnesium (Mg), silver (Ag), or an alloy of magnesium (Mg) and silver (Ag). In an embodiment, where the cathode electrode 343 includes or is formed of a semi-transmissive conductive material, light emission efficiency may be increased by microcavity effects.

The encapsulation layer 345 is disposed on the light emitting element layer EML. In an embodiment, the encapsulation layer 305 serves to prevent oxygen or moisture from permeating the light emitting layer 342 and the cathode electrode 343. In such an embodiment, the encapsulation layer 345 may include at least one inorganic film. The inorganic film may include or be formed of silicon nitride, aluminum nitride, zirconium nitride, titanium nitride, hafnium nitride, tantalum nitride, silicon oxide, aluminum oxide, or titanium oxide. The encapsulation layer 345 may further include at least one organic film. The organic film may be formed to have a sufficient thickness to prevent foreign matter (particles) from entering into the encapsulation layer 305 and entering the light emitting layer 342 and the cathode electrode 343. The organic film may include at least one of epoxy, acrylate, and urethane acrylate.

The color filter layer CFL is disposed on one surface of the second substrate 112 facing the first substrate 111. The color filter layer CFL may include a black matrix 360 and color filters 370.

The black matrix 360 may be disposed on one surface of the second substrate 112. The black matrix 360 may be disposed not to overlap the sub-pixels PX1, PX2, and PX3 but to overlap the pixel defining film 344. The black matrix 360 may include a black dye that may block light without transmitting the light, or may include an opaque metal material.

In an embodiment, the color filters 370 may be arranged to overlap the sub-pixels PX1, PX2, and PX3. The first color filters 371 may be arranged to overlap the first sub pixels PX1, the second color filters 372 may be arranged to overlap the second sub-pixels PX2, and the third color filters 373 may be arranged to overlap the third sub-pixels PX3.

In such an embodiment, the first color filter 371 may be a light transmitting filter of a first color that transmits light of the first color, the second color filter 372 may be a light transmitting filter of a second color that transmits light of the second color, and the third color filter 373 may be a light transmitting filter of a third color that transmits light of the third color. In one embodiment, for example, the first color may be red, the second color may be green, and the third color may be blue, but the invention is not limited thereto. In an embodiment, the peak wavelength range of red light transmitted through the first color filter 371 may be in a range of about 620 nm to 750 nm, the peak wavelength range of green light transmitted through the second color filter 372 may be in a range of about 500 nm to 570 nm, and the peak wavelength range of blue light transmitted through the third color filter 373 may be in a range of about 450 nm to 490 nm.

The edges of the two color filters adjacent to each other may overlap the black matrix 360. Thus, the color mixture occurring when light emitted from the light emitting layer 342 of a sub-pixel moves to the color filter of a sub-pixel adjacent thereto may be effectively prevented by the black matrix 360.

An overcoat layer may be disposed on the color filters 370 to planarize a step due to the color filters 370 and the black matrix 360. Alternatively, the overcoat layer may be omitted.

The optical wavelength conversion layer QDL is disposed on the color filter layer CFL. The optical wavelength conversion layer QDL may include a first capping layer 351, a first wavelength conversion layer 352, a second wavelength conversion layer 353, a third wavelength conversion layer 354, a second capping layer 355, an interlayer organic film 356, and a third capping layer 357.

The first capping layer 351 may be disposed on the color filter layer CFL. The first capping layer 351 serves to prevent external moisture or oxygen from entering into the first wavelength conversion layer 352, the second wavelength conversion layer 353, and the third wavelength conversion layer 354 through the color filter layer CFL. The first capping layer 351 may include or be formed of an inorganic film including silicon nitride, aluminum nitride, zirconium nitride, titanium nitride, hafnium nitride, tantalum nitride, silicon oxide, aluminum oxide, or titanium oxide.

The first wavelength conversion layer 352, the second wavelength conversion layer 353, and the third wavelength conversion layer 354 may be arranged on the first capping layer 351.

The first wavelength conversion layer 352 may be disposed to overlap the first sub-pixel PX1. The first wavelength conversion layer 352 may convert short-wavelength light such as a blue light or a ultraviolet light emitted from the light emitting layer 342 of the first sub-pixel PX1 into light of the first color. In such an embodiment, the first wavelength conversion layer 352 may include a first base resin, a first wavelength shifter, and a first scatterer.

In an embodiment, the first base resin is a material having high light transmittance and high dispersion characteristics for the first wavelength shifter and the first scatterer. In one embodiment, for example, the first base resin may include an organic material such as an epoxy resin, an acrylic resin, a cardo-based resin, or an imide resin.

The first wavelength shifter may convert or shift the wavelength range of the incident light or the light incident thereto. The first wavelength shifter may be a quantum dot, a quantum rod, or a phosphor. In an embodiment, where the first wavelength shifter is a quantum dot, the first wavelength shifter may have a specific band gap depending on its composition and size as a semiconductor nanocrystal material. Therefore, the first wavelength shifter may absorb incident light and then emit light having a specific wavelength. In an embodiment, the first wavelength shifter may have a core-shell structure including a core including nanocrystals and a shell surrounding the core. In such an embodiment, the nanocrystals constituting the core may include IV group nanocrystals, II-VI group compound nanocrystals, III-V group compound nanocrystals, IV-VI group nanocrystals, and combinations thereof. The shell may serve as a protective layer for preventing the chemical denaturation of the core to maintain semiconductor characteristics and/or as a charging layer for imparting electrophoretic characteristics to the quantum dots. The shell may be a single layer or multiple layers, and the shell may include a metal or nonmetal oxide, a semiconductor compound, or a combination thereof, for example.

The first scatterer may have a different refractive index different from the first base resin, and may form an optical interface together with the first base resin. In one embodiment, for example, the first scatterer may be light scattering particles. In one embodiment, for example, the first scatterer may be metal oxide particles such as titanium oxide ($TiO_2$) particles, silicon oxide ($SiO_2$) particles, zirconium oxide ($ZrO_2$) particles, aluminum oxide ($Al_2O_3$) particles, indium oxide ($In_2O_3$) particles, or zinc oxide (ZnO) particles. Alternatively, the first scatterer may be organic particles such as acrylic resin particles or urethane resin particles.

The first scatterer may scatter incident light in a random direction without substantially changing the wavelength of light passing through the first wavelength conversion layer 352. Accordingly, the length of a path of light passing through the first wavelength conversion layer 352 may be increased, such that the color conversion efficiency by the first wavelength shifter may be increased.

In an embodiment, the first wavelength conversion layer 352 may overlap the first color filter 371. Therefore, a part of short-wavelength light such as a blue light or a ultraviolet light provided from the first sub-pixel PX1 may not be converted into light of the first color by the first wavelength shifter, but may be transmitted through the first wavelength conversion layer 352 without wavelength conversion. However, short wavelength light such as a blue light or a ultraviolet light, which is not converted by the first wavelength conversion layer 352 and is incident on the first color filter 371, may not be transmitted through the first color filter 371. In such an embodiment, the light of the first color converted by the first wavelength conversion layer 352 may be transmitted through the first color filter 371 and emitted toward the second substrate 112.

The second wavelength conversion layer 353 may be disposed to overlap the second sub-pixel PX2. The second wavelength conversion layer 353 may convert short-wavelength light such as blue light or ultraviolet light emitted from the light emitting layer 342 of the second sub-pixel PX2 into light of the second color. In such an embodiment, the second wavelength conversion layer 353 may include a second base resin, a second wavelength shifter, and a second scatterer. Since the second base resin, second wavelength shifter and second scatterer of the second wavelength conversion layer 353 are substantially the same as those having been described in the first wavelength conversion layer 352, any repetitive detailed description thereof will be omitted. In an embodiment, where the first wavelength shifter and the second wavelength shifter are quantum dots, the diameter of the second wavelength shifter may be smaller than the diameter of the first shifter diameter.

In an embodiment, the second wavelength conversion layer 353 may overlap the second color filter 372. Therefore, a part of short-wavelength light such as a blue light or a ultraviolet light provided from the second sub-pixel PX2 may not be converted into light of the second color by the second wavelength shifter, but may be directly transmitted through the second wavelength conversion layer 353. However, short wavelength light such as a blue light or a ultraviolet light, which is not converted by the second wavelength conversion layer 353 and is incident on the second color filter 372, may not be transmitted through the second color filter 372. In such an embodiment, the light of the second color converted by the second wavelength conversion layer 353 may be transmitted through the second color filter 372 and emitted toward the second substrate 112.

The third wavelength conversion layer 354 may be disposed to overlap the third sub-pixel PX3. The third wavelength conversion layer 354 may convert short-wavelength light such as a blue light or a ultraviolet light emitted from the light emitting layer 342 of the third sub-pixel PX3 into light of the third color. In such an embodiment, the third wavelength conversion layer 354 may include a third base resin and a third scatterer. Since the third base resin and third scatterer of the third wavelength conversion layer 354 are substantially the same as those having been described in the first wavelength conversion layer 352, any repetitive detailed description thereof will be omitted.

In an embodiment, the third wavelength conversion layer 354 may overlap the third color filter 373. Therefore, short-wavelength light such as a blue light or a ultraviolet light provided from the third sub-pixel PX3 may be directly transmitted through the third wavelength conversion layer 354, and the light having passed through the third wavelength conversion layer may be transmitted through the third color filter 373 and emitted toward the second substrate 112.

The second capping layer 355 may be disposed on the first wavelength conversion layer 352, the second wavelength conversion layer 353, the third wavelength conversion layer 354, and the first capping layer 351 exposed without being covered by the first to third wavelength conversion layers 352, 353, and 354. The second capping layer 355 serves to prevent external moisture or oxygen from entering into the first wavelength conversion layer 352, the second wavelength conversion layer 353, and the third wavelength conversion layer 354. The second capping layer 355 may include or be formed of an inorganic film including silicon nitride, aluminum nitride, zirconium nitride, titanium nitride, hafnium nitride, tantalum nitride, silicon oxide, aluminum oxide, or titanium oxide.

The interlayer organic film 356 may be disposed on the second capping layer 355. The interlayer organic film 356 may be a planarization layer for planarizing a step due to the wavelength conversion layers 352, 353, and 354. The interlayer organic film 356 may be an organic film such as an acryl resin film, an epoxy resin film, a phenolic resin film, a polyamide resin film, or a polyimide resin film.

The third capping layer 357 may be disposed on the interlayer organic film 356. The third capping layer 357 may include or be formed of an inorganic film including silicon nitride, aluminum nitride, zirconium nitride, titanium nitride, hafnium nitride, tantalum nitride, silicon oxide, aluminum oxide, or titanium oxide.

The filler FL may be disposed between the thin film encapsulation layer TFEL disposed on the first substrate 111 and the third capping layer 357 disposed on the second substrate 112. The filler FL may include or be made of a material having a buffering function. In one embodiment, for example, the filler FL may be an organic film such as an acryl resin film, an epoxy resin film, a phenolic resin film, a polyamide resin film, or a polyimide resin film.

In an embodiment, a sealing material for attaching the first substrate 111 to the second substrate 112 may be disposed in the non-display area of the display panel 110, and the filler FL may be surrounded by the sealing material when viewed on the plane. The sealing material may be a glass frit or a sealant.

According to an embodiment, as shown in FIG. 9, the first to third sub-pixels PX1, PX2 and PX3 emit short-wavelength light such as a blue light or a ultraviolet light. In such an embodiment, the light of the first sub-pixel PX1 may be converted into light of the first color through the first wavelength conversion layer 352 and then output through the first color filter CF1, the light of the second sub-pixel PX1 may be converted into light of the second color through the second wavelength conversion layer 353 and then output through the second color filter CF2, and the light of the third sub-pixel PX3 may be output through the third wavelength conversion layer 354 and the third color filter CF3, so that white light may be output.

In an embodiment, as shown in FIG. 9, the sub-pixels PX1, PX2, and PX3 are formed in a top emission manner in which light is emitted toward the second substrate 112, that is, in an upward direction, such that the heat radiation film 130 including an opaque material such as graphite or aluminum may be disposed on one surface of the first substrate 111.

FIG. 10 is a cross-sectional view showing an embodiment of a first vibration generator, and FIGS. 11A and 11B are views showing an embodiment of the vibration of a display panel by the first vibration generator shown in FIG. 10. FIGS. 10, 11A, and 11B show an enlarged view corresponding to the area A in FIG. 6A.

Referring to FIGS. 10, 11A, and 11B, the first vibration generator may be an exciter for vibrating the display panel 110 by generating a magnetic force using a first voice coil. In an embodiment, a hole may be defined or formed in an area where the first vibration generator 210 is disposed in the control circuit board 160.

The first vibration generator 210 may include a first magnet 211, a bobbin 212, a first voice coil 213, a damper 214, and a lower plate 215.

The first magnet 211 may be a permanent magnet, and a sintered magnet such as barium ferrite may be used as the first magnet 211. The first magnet 211 may be a ferric trioxide ($Fe_2O_3$) magnet, a barium carbonate ($BaCO_3$) magnet, a neodymium magnet, or an alloy cast magnet of strontium ferrite having improved magnetic properties, aluminum (Al), nickel (Ni), or cobalt (Co), but is not limited thereto. The material of neodymium magnet may be, for example, neodymium-iron-boron (Nd—Fe—B).

The first magnet 211 may include a plate 211a, a central protrusion portion 211b protruding from the center of the plate 211a, and a side wall portion 211c protruding from the edge of the plate 211a. The central protrusion portion 211b and the side wall portion 211c may be spaced apart from each other by a predetermined distance, and thus a predetermined space may be formed between the central protrusion portion 211b and the side wall portion 211c. In an embodiment, where the first magnet 211 has a cylindrical shape, a circular space may be formed at a bottom surface of the cylindrical shape.

The central protrusion portion 211b of the first magnet 211 may have magnetic properties of the N pole, and the plate 211a and the sidewall portion 211c may have magnetic properties of the S pole, so that an external magnetic field may be generated between the central protrusion portion 211b and the plate 211a of the first magnet 211 and between the central protrusion portion 211b and side wall portion 211c of the first magnet 211.

The bobbin 212 may be in a cylindrical shape. The central protrusion portion 211b of the first magnet 211 may be disposed inside the bobbin 212. In an embodiment, the bobbin 212 may be disposed to surround the central protrusion portion 211b of the first magnet 211. In such an embodiment, the side wall portion 211c of the first magnet 211 may be disposed outside the bobbin 212. In such an embodiment, the side wall portion 211c of the first magnet 211 may be disposed to surround the bobbin 212. A space may be formed between the bobbin 212 and the central protrusion portion 211b of the first magnet 211 and between the bobbin 212 and the side wall portion 211c of the first magnet 211.

The bobbin 212 may include or be formed of a pulp or paper processed material; aluminum, magnesium, or an alloy thereof; synthetic resin such as polypropylene; or polyamide-based fiber. One end of the bobbin 212 may be bonded to the heat radiation film 130 by an adhesive member. The adhesive member may be a double-sided tape.

The first voice coil 213 is wound (or rolled) on the outer peripheral surface of the bobbin 212. One end of the voice coil 213 adjacent to one end of the bobbin 212 may receive a first first driving voltage, and the other end of the first voice coil 213 adjacent to the other end of the bobbin 212 may receive a second first driving voltage. Accordingly, a current may flow through the first voice coil 213 according to the first first driving voltage and the second first driving voltage. An applied magnetic field may be generated around the first voice coil 213 in accordance with the current flowing through the first voice coil 213. In such an embodiment, the direction of the current flowing through the first voice coil 213 when the first first driving voltage is a positive polarity voltage and the second first driving voltage is a negative polarity voltage is reversed from the direction of the current flowing through the first voice coil 213 when the first first driving voltage is a negative polarity voltage and the second first driving voltage is a positive polarity voltage. Therefore, the N pole and S pole of the applied magnetic field formed around the first voice coil 213 are changed according to an alternate current ("AC") driving of the first first driving voltage and the second first driving voltage, and thus attractive force and repulsive force are alternately applied to the first magnet 211 and the first voice coil 213. Therefore, the bobbin 212 on which the first voice coil 213 is wound may reciprocate in the third direction (Z-axis direction) as shown in FIGS. 11A and 11B. Accordingly, the display panel 110 and the heat radiation film 130 vibrate in the third direction (Z-axis direction), and thus a sound may be output.

The damper 214 is disposed between a part of the upper side of the bobbin 212 and the side wall portion 211c of the first magnet 211. The damper 214 regulates the vertical vibration of the bobbin 212 while contracting and relaxing in accordance with the vertical movement of the bobbin 212. In such an embodiment, since the damper 214 is connected to the bobbin 212 and the side wall portion 211c of the first magnet 211, the vertical movement of the bobbin 212 may be restricted by the restoring force of the damper 214. In one embodiment, for example, when the bobbin 212 vibrates at a predetermined height or higher, or vibrates at a predetermined height or lower, the bobbin 212 may be restored to its original position by the restoring force of the damper 214.

The lower plate 215 may be disposed on the lower surface of the first magnet 211. The lower plate 215 may be integrally formed with the first magnet 211 as a single unitary unit or may be formed separately from the first magnet 211. In an embodiment, where the lower plate 215 is formed separately from the first magnet 211, the first magnet 211 may be attached to the lower plate 215 through an adhesive member such as a double-sided tape.

The lower plate 215 may be fixed to the control circuit board 160 through a fixing member 216 such as a screw. Thus, the first magnet 211 of the second vibration generator 220 may be fixed to the control circuit board 160.

In an embodiment, the first magnet 211 and lower plate 215 of the first vibration generator 210 may be fixed to the control circuit board 160, but embodiments of the invention are not limited thereto. Alternatively, the first magnet 211 and lower plate 215 of the first vibration generator 210 may be fixed to a system circuit board, a power supply circuit board, or a dummy circuit board instead of the control circuit board 160. The dummy circuit board refers to a circuit board to which the first vibration generator 210 is fixed and in which no other circuit is disposed. The dummy circuit board may be a flexible printed circuit board or a printed circuit board. Alternatively, the first magnet 211 and lower plate 215 of the first vibration generator 210 may be fixed to the lower cover 180 instead of the control circuit board 160.

Figure 12:
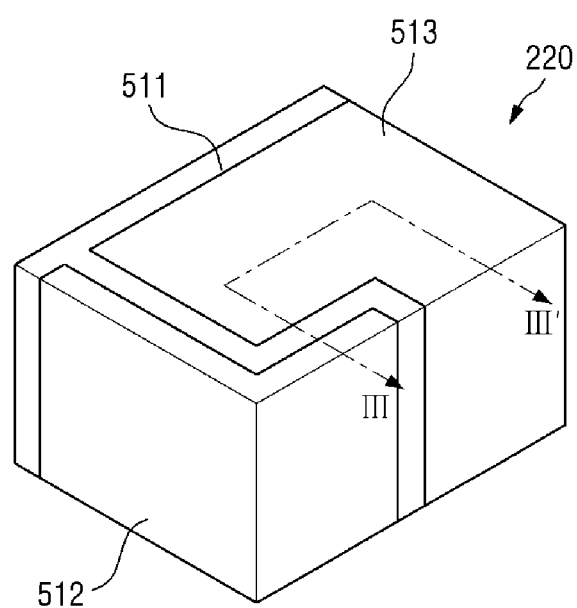
FIG. 12 is a perspective view showing an embodiment of a second vibration generator.
Figure 13:
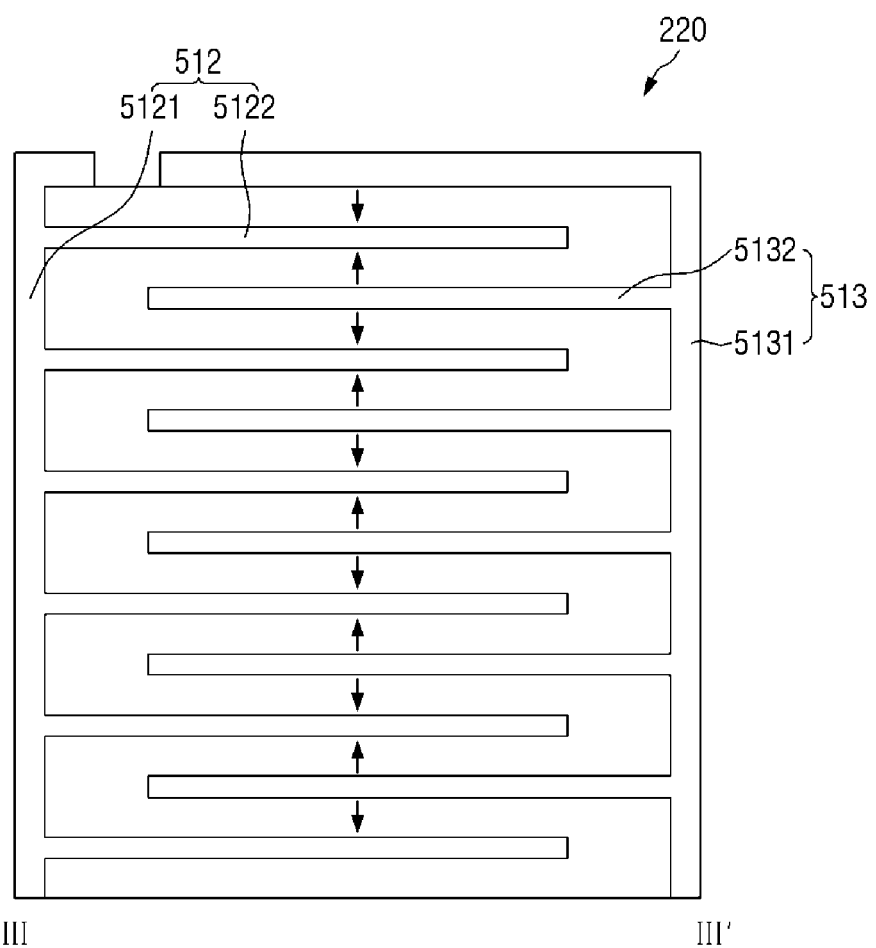
FIG. 13 is a cross-sectional view taken along III-III' of FIG. 12.
Figure 13:
Figure 14A:
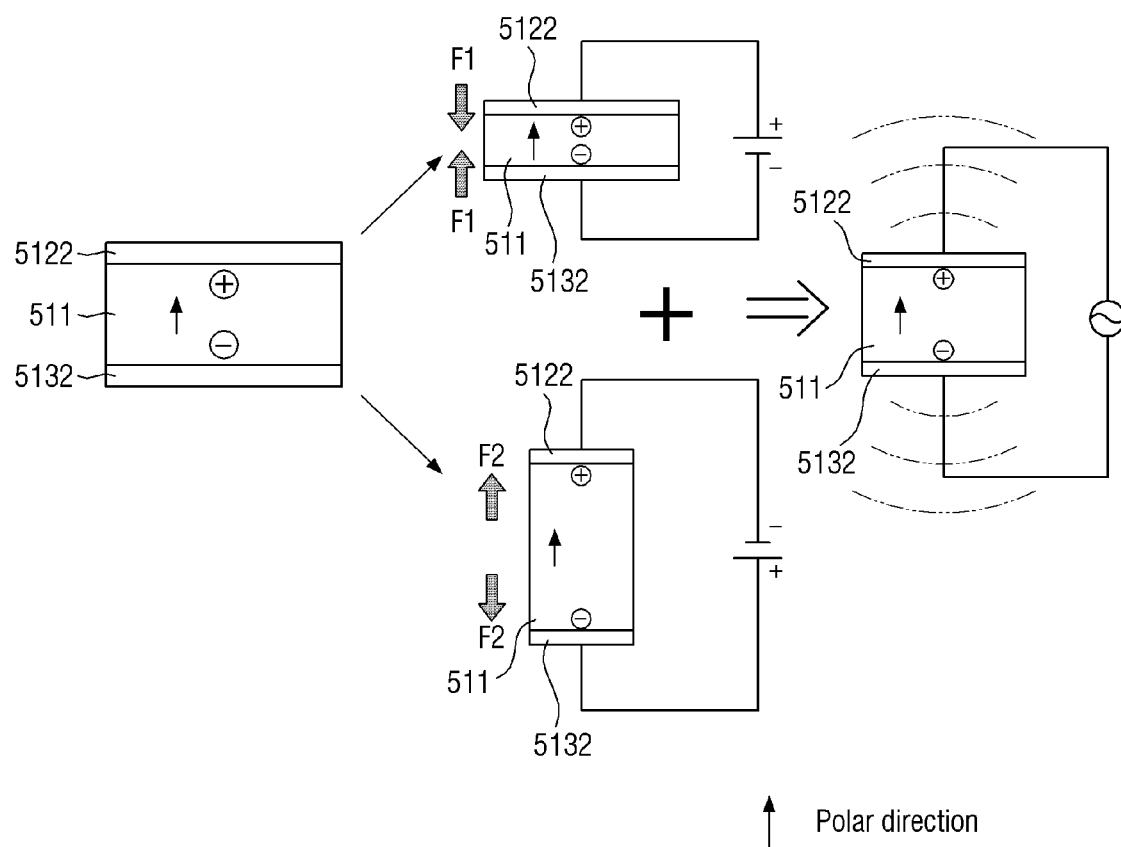
FIG. 14A is a schematic view showing a method of vibrating a vibration layer disposed between a first branch electrode and a second branch electrode of a first vibration generator.
Figure 14B:
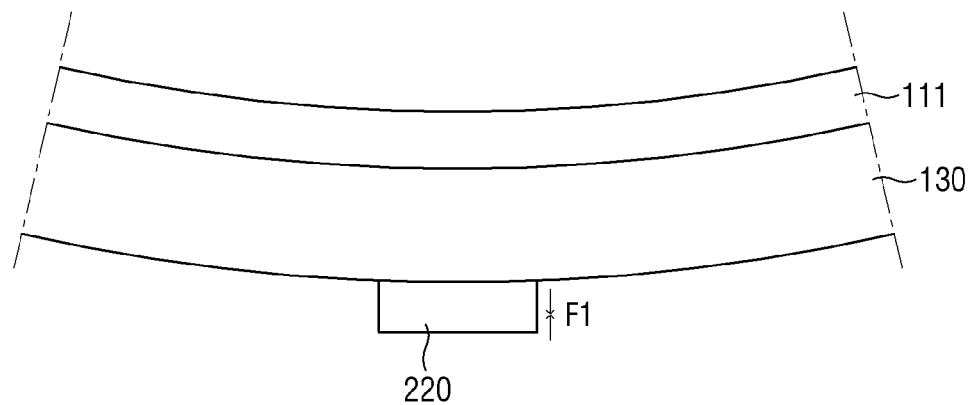
FIGS. 14B and 14C are side views showing the vibration of a display panel by the first vibration generator shown in FIG. 12.
Figure 14C:
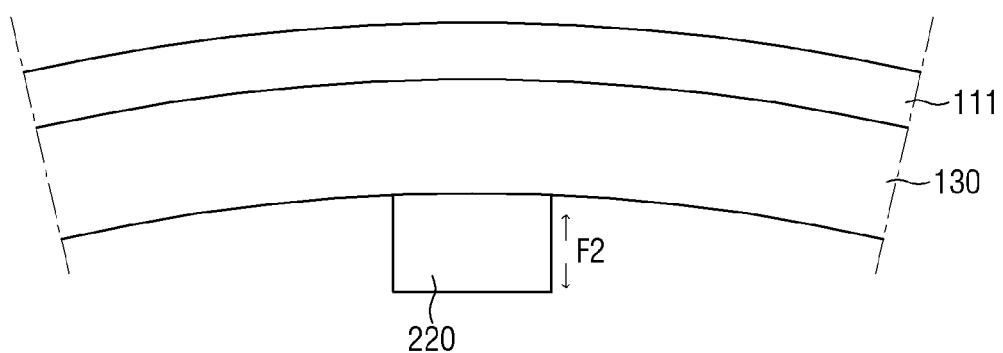
Figure 14C:
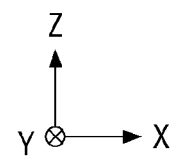

FIG. 12 is a perspective view showing an embodiment of a second vibration generator, FIG. 13 is a cross-sectional view taken along of FIG. 12, FIG. 14A is a schematic view showing a method of vibrating a vibration layer disposed between a first branch electrode and a second branch electrode of a first vibration generator, and FIGS. 14B and 14C are side views showing the vibration of a display panel by the first vibration generator shown in FIG. 12.

Referring to FIGS. 12 and 13, the second vibration generator 220 may include a piezoelectric element that vibrates the display panel 110 by contracting or expanding according to an applied voltage or a voltage applied thereto. In one embodiment, for example, the second vibration generator 220 may include a vibration layer 511, a first electrode 512, and a second electrode 513.

The first electrode 512 may include a first stem electrode 5121 and first branch electrodes 5122. The first stem electrode 5121 may be disposed on only one side surface of the vibration layer 511 or may be disposed on the plurality of side surfaces of the vibration layer 511 as shown in FIG. 12. The first stem electrode 5121 may be disposed on the upper surface of the vibration layer 511. The first branch electrodes 5122 may be branched from the first stem electrode 5121. The first branch electrodes 5122 may be arranged in parallel with each other.

The second electrode 513 may include a second stem electrode 5131 and second branch electrodes 5132. The second stem electrode 5131 may be disposed on another side surface of the vibration layer 511 or may be disposed on the plurality of side surfaces of the vibration layer 511 as shown in FIG. 12. In an embodiment, as shown in FIG. 12, the first stem electrode 5121 may be disposed on any one side surface of the plurality of side surfaces on which the second stem electrode 5131 is disposed. The second stem electrode 5131 may be disposed on the upper surface of the vibration layer 511. The first stem electrode 5121 and the second stem electrode 5131 may not overlap each other. The second branch electrodes 5132 may be branched from the second stem electrode 5131. The second branch electrodes 5132 may be arranged in parallel with each other.

The first branch electrodes 5122 and the second branch electrodes 5132 may be arranged in parallel to each other in the horizontal direction (X-axis direction or Y-axis direction). In an embodiment, the first branch electrodes 5122 and the second branch electrodes 5132 may be arranged alternately in the vertical direction (Z-axis direction). In such an embodiment, the first branch electrodes 5122 and the second branch electrodes 5132 may be arranged repeatedly in the order of the first branch electrode 5122, the second branch electrode 5132, the first branch electrode 5122, and the second branch electrode 5132 in the vertical direction (Z-axis direction).

The first electrode 512 and the second electrode 513 may be connected to the metal lines or pad electrodes of the sound circuit board 250.

The vibration layer 511 may be a piezoelectric element that is deformed based on a first driving voltage applied to the first electrode 512 and a second driving voltage applied to the second electrode 513. In an embodiment, the vibration layer 511 may be at least one of a poly vinylidene fluoride ("PVDF") film, a piezoelectric body of lead zirconate titanate ("PZT"), and an electroactive polymer.

Since the manufacturing temperature of the vibration layer 511 is high, each of the first electrode 512 and the second electrode 513 may include or be formed of silver (Ag) or an alloy of silver (Ag) and palladium (Pd), which has a high melting point. In an embodiment, where each of the first electrode 512 and the second electrode 513 includes or is formed of an alloy of silver (Ag) and palladium (Pd) to increase the melting point of each of the first electrode 512 and the second electrode 513, the content of silver (Ag) may be higher than the content of palladium (Pd).

The vibration layer 511 may be disposed between the first branch electrodes 5122 and the second branch electrodes 5132. The vibration layer 511 contracts or expands depending on a difference between the first driving voltage applied to the first branch electrode 5122 and the second driving voltage applied to the second branch electrode 5132.

In an embodiment, as shown in FIG. 13, when the polarity direction of the vibration layer 511 disposed between the first branch electrode 5122 and the second branch electrode 5132 disposed under the first branch electrode 5122 is an upward direction (↑), the vibration layer 511 has a positive polarity in an upper area adjacent to the first branch electrode 5122 and has a negative polarity in a lower area adjacent to the second branch electrode 5132. In such an embodiment, as shown in FIG. 13, when the polarity direction of the vibration layer 511 disposed between the second branch electrode 5132 and the first branch electrode 5122 disposed under the second branch electrode 5132 is a downward direction (↓), the vibration layer 511 has a negative polarity in an upper area adjacent to the second branch electrode 5132 and has a positive polarity in a lower area adjacent to the first branch electrode 5122. The polarity direction of the vibration layer 511 may be determined by a poling process of applying an electric field to the vibration layer 511 using the first branch electrode 5122 and the second branch electrode 5132.

In an embodiment, as shown in FIG. 14A, in a case where the polarity direction of the vibration layer 511 disposed between the first branch electrode 5122 and the second branch electrode 5132 disposed under the first branch electrode 5122 is an upward direction (↑), when a first second driving voltage of positive polarity is applied to the first branch electrode 5122 and a second second driving voltage of negative polarity is applied to the second branch electrode 5132, the vibration layer 511 may be contracted by a first force F1. The first force F1 may be a contractile force. In such an embodiment, when a first second driving voltage of negative polarity is applied to the first branch electrode 5122 and a second second driving voltage of positive polarity is applied to the second branch electrode 5132, the vibration layer 511 may be expanded by a second force F2. The first force F1 may be an extensible force.

In such an embodiment, in a case where the polarity direction of the vibration layer 511 disposed between the second branch electrode 5132 and the first branch electrode 5122 disposed under the second branch electrode 5132 is a downward direction (↓), when a first second driving voltage of positive polarity is applied to the second branch electrode 5132 and a second second driving voltage of negative polarity is applied to the first branch electrode 5122, the vibration layer 511 may be expanded by an extensible force. In such an embodiment, when a first second driving voltage of negative polarity is applied to the second branch electrode 5132 and a second second driving voltage of positive polarity is applied to the first branch electrode 5122, the vibration layer 511 may be contracted by a contractile force. The second force F2 may be a contractile force.

According to an embodiment, as shown in FIGS. 12 and 13, when the second driving voltage applied to the first electrode 512 and the second driving voltage applied to the second electrode 513 are alternately repeated in positive and negative polarities, the vibration layer 511 repeats contraction and expansion. Thus, the second vibration generator 220 vibrates.

In an embodiment, where the second vibration generator 220 is disposed on one surface of the heat radiation film 130, when the vibration layer 511 of the second vibration generator 220 contracts and expands, the display panel 110 is vibrated downward and upward by stress as shown in FIGS. 14B and 14C. In such an embodiment, since the display panel 110 may be vibrated by the second vibration generator 220, the display device 10 may output a sound.

Figure 15:
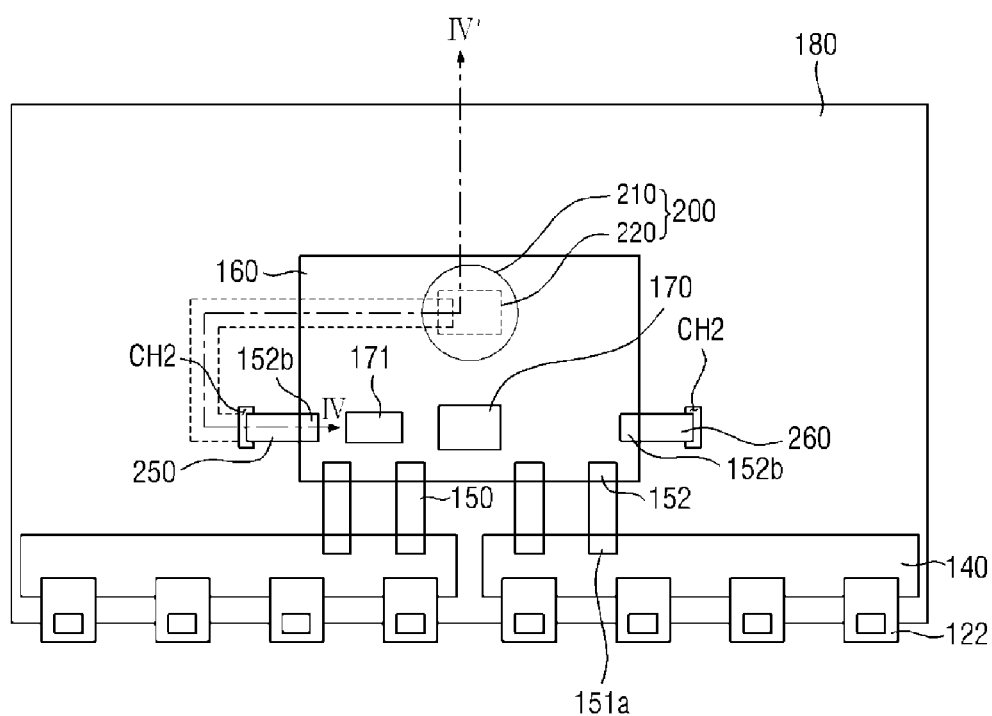
FIG. 15 is a bottom view showing an alternative embodiment of a display device.
Figure 15:
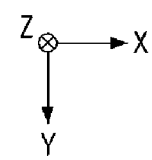
Figure 16:
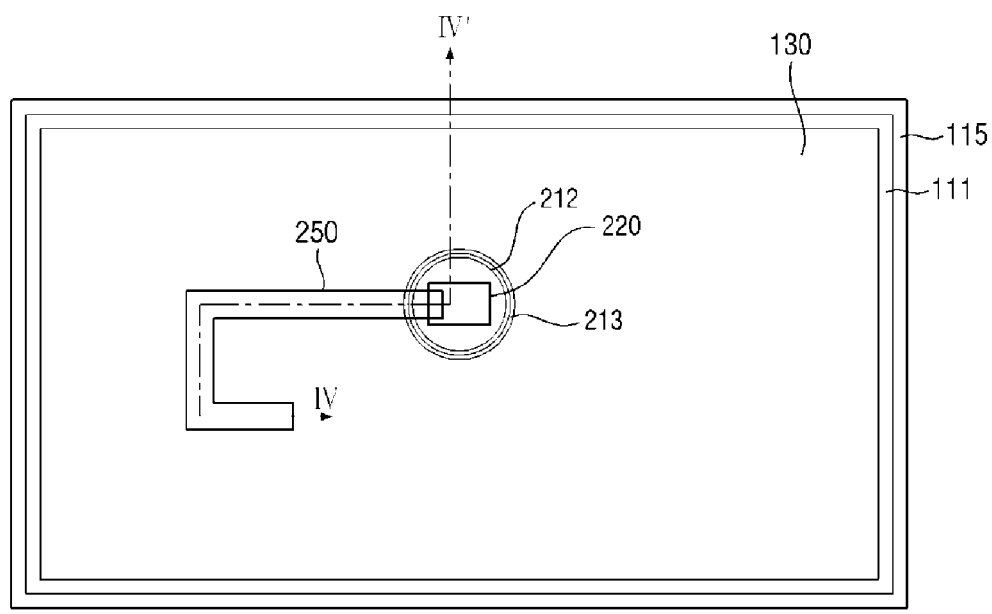
FIG. 16 is a bottom view showing an embodiment of a display device in a state where the lower cover and control circuit board in FIG. 15 are omitted.
Figure 16:
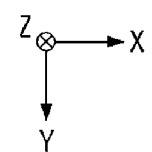
Figure 17:
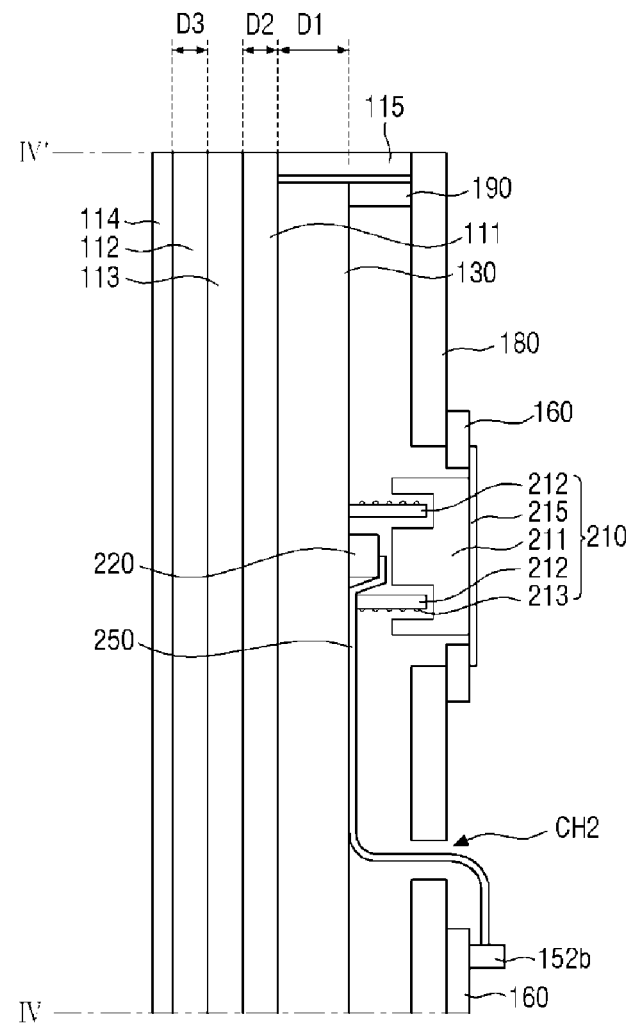
FIG. 17 is a cross-sectional view taken along IV-IV' of FIGS. 15 and 16.
Figure 17:
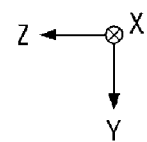

FIG. 15 is a bottom view showing an alternative embodiment of a display device, FIG. 16 is a bottom view showing an embodiment of a display device in a state where the lower cover and control circuit board in FIG. 15 are omitted, and FIG. 17 is a cross-sectional view taken along IV-IV' of FIGS. 15 and 16.

The embodiment shown in FIGS. 15 to 17 is substantially the same as the embodiment shown in FIGS. 3, 4 and 6 except that the flexible films 122 are bent toward the lower portion of the lower cover 180 and the source circuit board 140 is disposed on one surface of the lower cover 180. The same or like elements shown in FIGS. 15 to 17 have been labeled with the same reference characters as used above to describe the embodiment of FIGS. 3, 4 and 6, and any repetitive detailed description thereof will hereinafter be omitted or simplified, and differences from the embodiment shown in FIGS. 3, 4 and 6 will be described in detail.

Referring to FIGS. 15 to 17, in an embodiment, the flexible films 122 may be bent toward the lower portion of the lower cover 180, and thus the source circuit board 140 is disposed on one surface of the lower cover 180. Accordingly, the cables 150 connecting the source circuit board 140 and the control circuit board 160 may be directly connected without being disposed through the first cable hole CH1 defined through the lower cover 180.

In such an embodiment, the sound circuit board 250 connected to the second vibration generator 220 may be connected to the second second connector 152b of the control circuit board 160 through a second cable hole CH2 defined through the lower cover 180. In such an embodiment, the second vibration generator 220 may be electrically connected to the control circuit board 160 by the sound circuit board 250. Thus, the second sound signal of the sound driving circuit 171 may be transmitted to the second vibration generator 220 through the sound circuit board 250. The second cable hole CH2 may be disposed adjacent to one side of the control circuit board 160 adjacent to the sound driving circuit 171. In one embodiment, for example, the second cable hole CH2 may be disposed adjacent to the right side of the control circuit board 160.

According to an embodiment, as shown in FIGS. 15 to 17, the sound circuit board 250 connected to the second vibration generator 220 is connected to the control circuit board 160 through the second cable hole CH2 defined through the lower cover 180, such that the control circuit board 160 and the second vibration generator 220 may be easily electrically connected to each other even when the second vibration generator 220 is disposed on one surface of the heat radiation film 130 and the control circuit board 160 is disposed on one surface of the lower cover 180.

Figure 18:
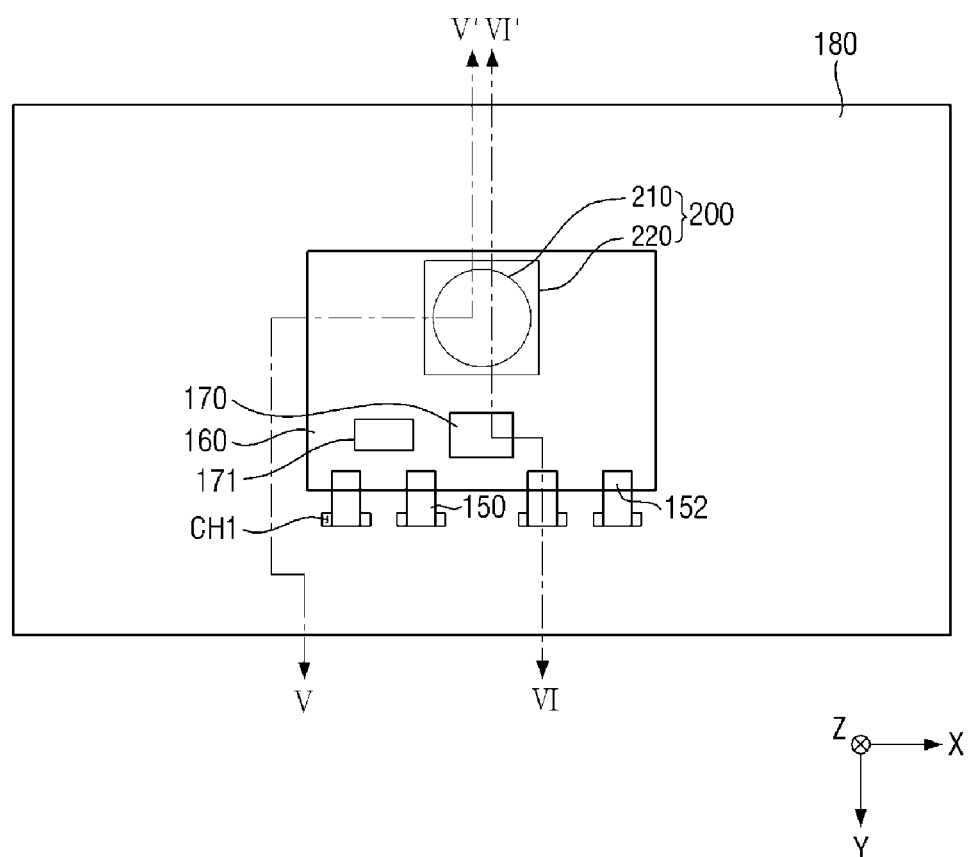
FIG. 18 is a bottom view showing another alternative embodiment of a display device.
Figure 19:
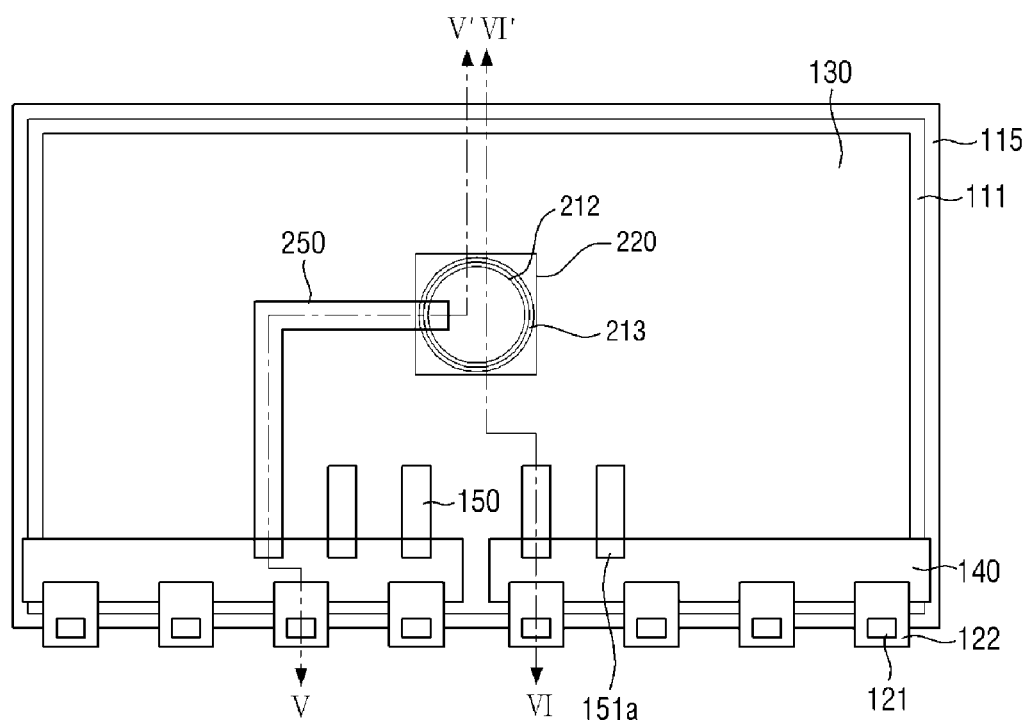
FIG. 19 is a bottom view showing an example of a display device in a state where the lower cover and control circuit board in FIG. 18 are omitted.
Figure 20:
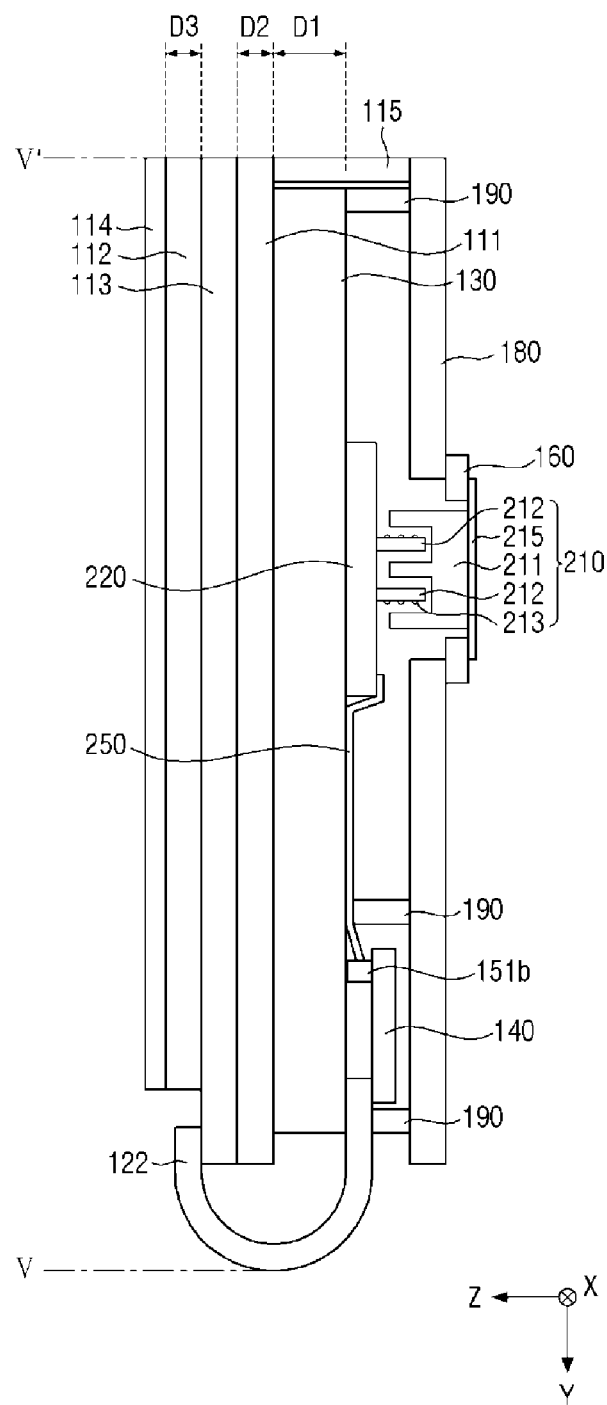
FIG. 20 is a cross-sectional view taken along V-V' of FIGS. 18 and 19.

FIG. 18 is a bottom view showing another alternative embodiment of a display device, FIG. 19 is a bottom view showing an embodiment of a display device in a state where the lower cover and control circuit board in FIG. 18 are omitted, and FIG. 20 is a cross-sectional view taken along V-V' of FIGS. 18 and 19.

The embodiment shown in FIGS. 18 to 20 is substantially the same as the embodiment shown in FIGS. 3, 4 and 6 except that the bobbin 212 of the first vibration generator 210 is disposed on the second vibration generator 220. The same or like elements shown in FIGS. 18 to 20 have been labeled with the same reference characters as used above to describe the embodiment of FIGS. 3, 4 and 6, and any repetitive detailed description thereof will hereinafter be omitted or simplified. The cross-sectional views taken along line VI-VI', shown in FIGS. 18 and 19, are substantially the same as those shown in FIG. 7, any repetitive detailed descriptions thereof will also be omitted.

Referring to FIGS. 18 to 20, in an embodiment, the second vibration generator 220 may be attached to one surface of the heat radiation film 130 by an adhesive member such as a double-sided adhesive. The bobbin 212 of the first vibration generator 210 may be attached to one surface of the second vibration generator 220 by an adhesive member such as double-sided adhesive.

The sound circuit board 250 may be disposed on one surface of the second vibration generator 220 without overlapping the bobbin 212 of the first vibration generator 210 as shown in FIG. 20. Alternatively, the bobbin 212 of the first vibration generator 210 may be disposed on the sound circuit board 250. The sound circuit board 250 disposed on one surface of the second vibration generator 220 may overlap the side wall portion of the first magnet 211 in the thickness direction of the display panel 110, that is, in the third direction (Z-axis direction).

According to an embodiment, as shown in FIGS. 18 to 20, since the first vibration generator 210 and second vibration generator 220 of the sound generator 200 are arranged to overlap each other in the thickness direction of the display panel 110, that is, in the third direction (Z-axis direction), the first vibration generator 210 and the second vibration generator 220 may simultaneously vibrate at a same position of the display panel 110 to output a sound. In such an embodiment, the first vibration generator 210 and the second vibration generator 220 may simultaneously vibrate the same vibration plane to output a sound. In this case, the first vibration generator 210 and the second vibration generator 220 may vibrate the display panel 110 by distributing a sound band. In one embodiment, for example, the first vibration generator 210 may vibrate the display panel 110 to output a sound of a high frequency band, and the second vibration generator 220 may vibrate the display panel 110 to output a sound of a middle frequency band. Accordingly, in such an embodiment, the sound generator 200 may provide a high-quality sound having both middle and high frequency bands.

Figure 21:
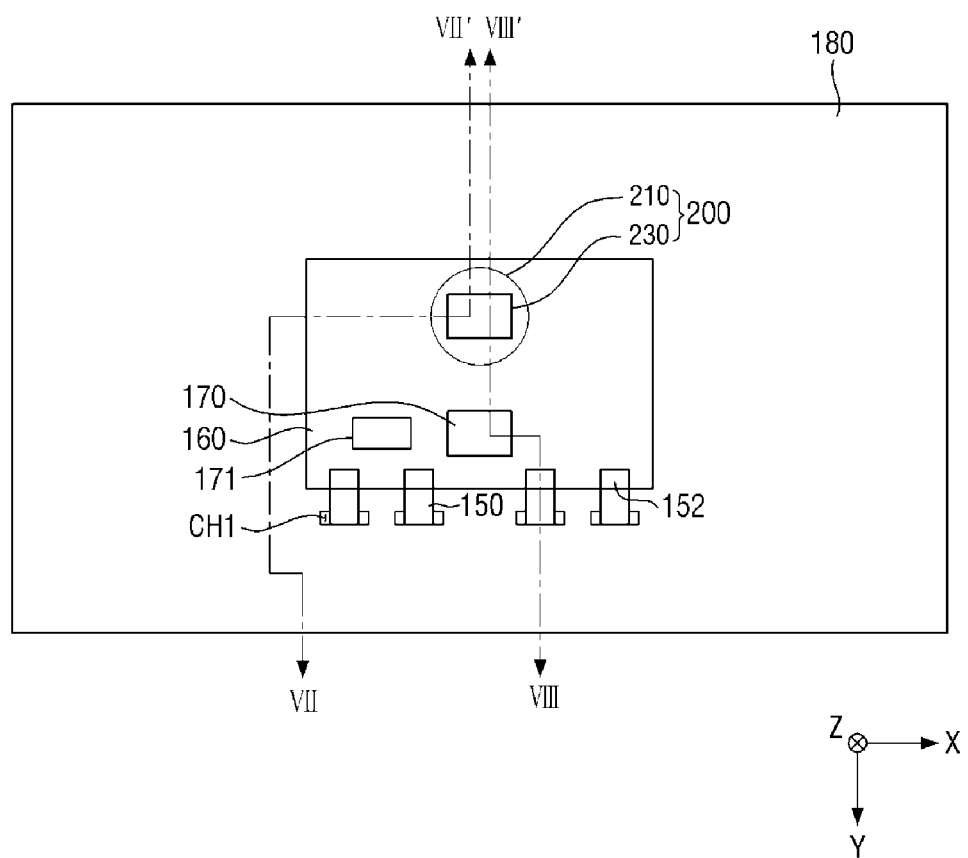
FIG. 21 is a bottom view showing another alternative embodiment of a display device.
Figure 22:
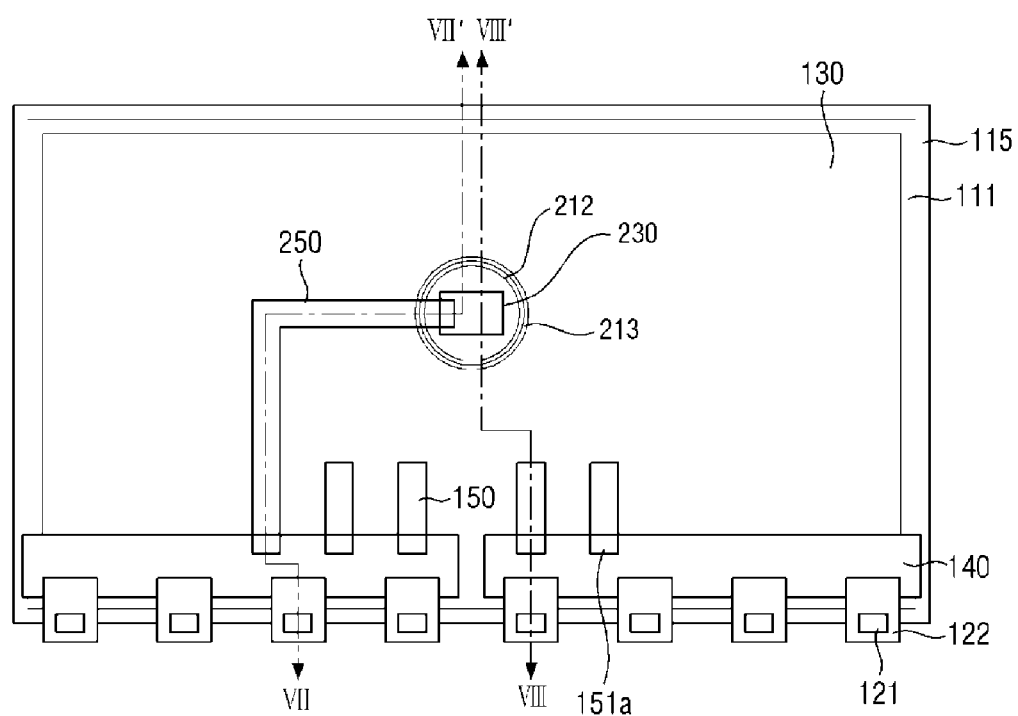
FIG. 22 is a bottom view showing an embodiment of a display device in a state where the lower cover and control circuit board in FIG. 21 are omitted.
Figure 22:
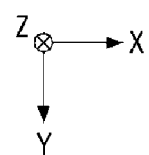
Figure 23:
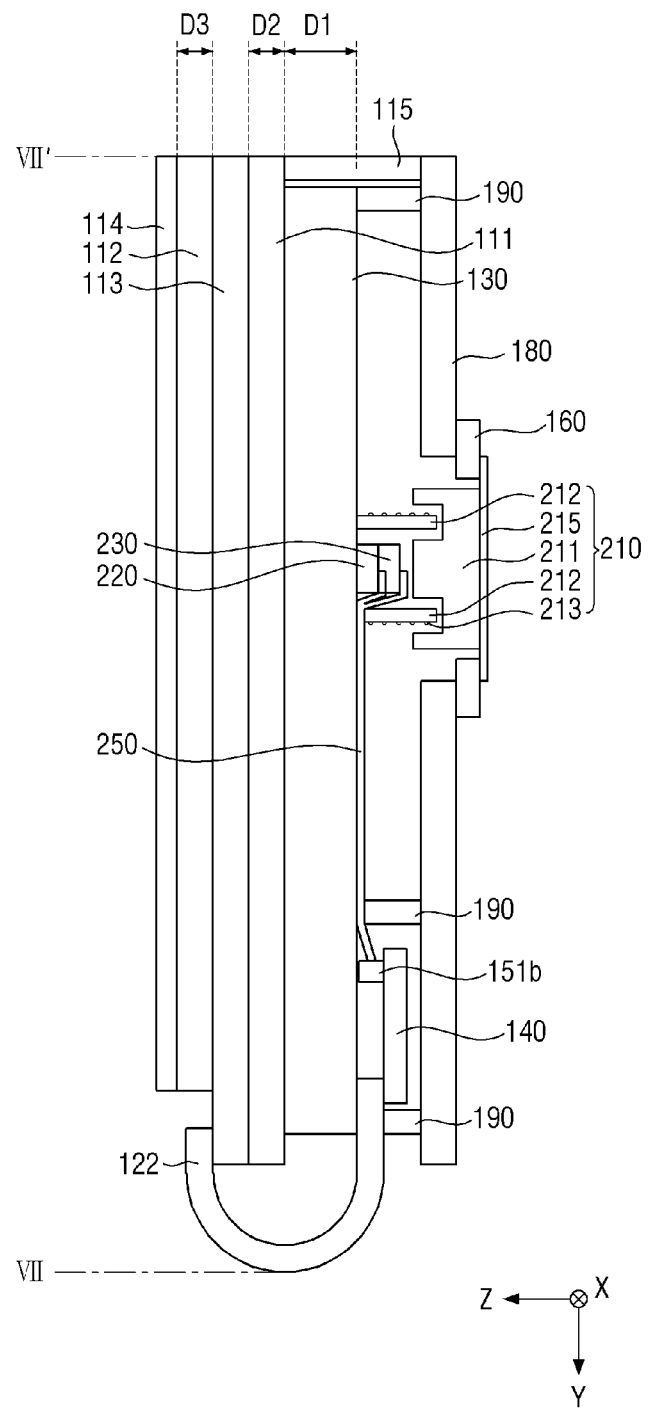
FIG. 23 is a cross-sectional view taken along VII-VII' of FIGS. 21 and 22.

FIG. 21 is a bottom view showing another alternative embodiment of a display device, FIG. 22 is a bottom view showing an example of a display device in a state where the lower cover and control circuit board in FIG. 21 are omitted, and FIG. 23 is a cross-sectional view taken along VII-VII' of FIGS. 21 and 22.

The embodiment shown in FIGS. 21 to 23 is from the same as the embodiment shown in FIGS. 3, 4 and 6 except that the sound generator 200 further includes a third vibration generator 230. The same or like elements shown in FIGS. 21 to 23 have been labeled with the same reference characters as used above to describe the embodiment of FIGS. 3, 4 and 6, and any repetitive detailed description thereof will hereinafter be omitted or simplified. The cross-sectional views taken along line VIII-VIII', shown in FIGS. 21 and 22, are substantially the same as those shown in FIG. 7, and any repetitive detailed description thereof will also be omitted.

Referring to FIGS. 21 to 23, in an embodiment, the sound generator 200 includes a first vibration generator 210, a second vibration generator 220, and a third vibration generator 230. In such an embodiment, as described above with reference to FIGS. 10, 11A, and 11B, the first vibration generator may be an exciter for vibrating the display panel 110 by generating a magnetic force using a first voice coil. In such an embodiment, as described above with reference to FIGS. 12, 13, 14A to 14C, the second vibration generator 220 may include a piezoelectric element that contracts or expands according to an applied voltage to vibrate the display panel 110. The third vibration generator 230 may be a linear resonant actuator ("LRA") or an eccentric rotating mass ("ERM") that vibrates the display panel 110 by generating a magnetic force using a second voice coil.

Figure 24:
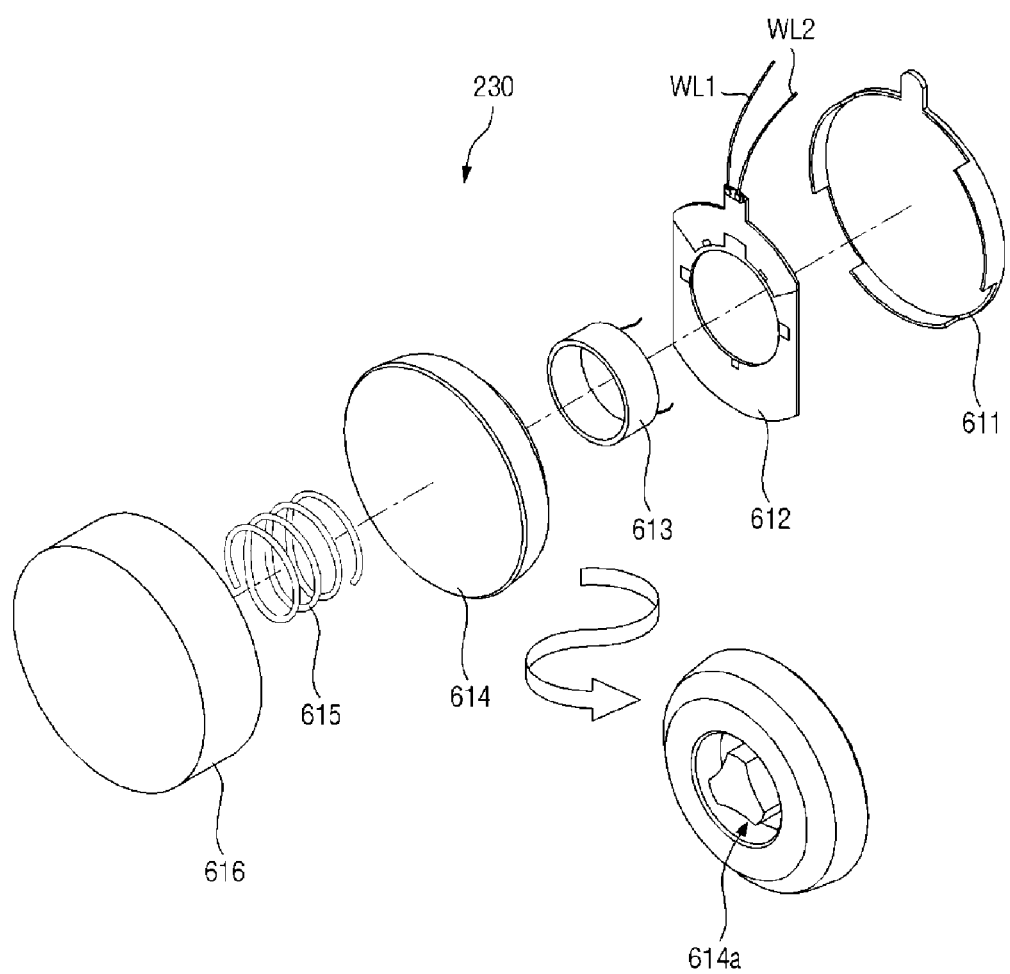
FIG. 24 is an exploded perspective view specifically showing a third vibration generator.

In an embodiment, where the third vibration generator 230 is the linear resonance actuator LRA as shown in FIG. 24, the third vibration generator 230 may include a lower chassis 611, a flexible circuit board 612, a second voice coil 613, a second magnet 614, a spring 615, and an upper chassis 616. The lower chassis 611 and the upper chassis 616 may include or be formed of a metal material. The flexible circuit board 612 is disposed on one surface of the lower chassis 611, facing the upper chassis 616, and is connected to a first sound line WL1 and a second sound line WL2. The second voice coil 613 may be connected to one surface of the flexible circuit board 612 facing the upper chassis 616. Thus, one end of the second voice coil 613 may be electrically connected to the first sound line WL1, and the other end thereof may be electrically connected to the second sound line WL2. The second magnet 614 may be a permanent magnet, and a voice coil groove 614a for accommodating the second voice coil 613 may be disposed on one surface of the second magnet 614 facing the second voice coil 613. The spring 615 is disposed between the second magnet 640 and the upper chassis 616.

The direction of a current flowing through the second voice coil 613 of the third vibration generator 230 may be controlled depending on a first third driving voltage applied to the first sound line WL1 and a second third driving voltage applied to the second sound line WL2. An applied magnetic field may be formed around the second voice coil 613 according to the current flowing through the second voice coil 613. In such an embodiment, the direction of the current flowing through the second voice coil 613 when the first third driving voltage is a positive polarity voltage and the second third driving voltage is a negative polarity voltage is reversed from the direction of the current flowing through the second voice coil 613 and when the second third driving voltage is a negative polarity voltage and the first third driving voltage is a positive polarity voltage. Attractive force and repulsive force are alternately applied to the second magnet 614 and the second voice coil 613 according to the AC driving of the first third driving voltage and the second third driving voltage. Therefore, the second magnet 614 may reciprocate between the second voice coil 613 and the upper chassis 616 by the spring 615, and thus the vibrating surface disposed on the upper chassis 616, that is, the display panel 110 may vibrate, thereby outputting a sound. The upper chassis 616 may be a surface that is disposed closest to the display panel 110.

The first vibration generator 210 may serve as a middle sound generator for outputting a sound of a middle frequency band. The second vibration generator 220 may serve as a high sound generator for outputting a sound of a high frequency band higher than that of the first vibration generator 210. The third vibration generator 230 may serve as a low sound generator for outputting a sound of a low frequency band. In such an embodiment, the display device 10 may provide a sound of a high frequency band, which may not be effectively provided by the first vibration generator 210 and the third vibration generator 230, by using the second vibration generator 220. In such an embodiment, the display device 10 may provide a sound of a middle frequency band, which may not be effectively provided by the second vibration generator 220 and the third vibration generator 230, by using the first vibration generator 210. In such an embodiment, the display device 10 may provide a sound of a low frequency band, which may not be effectively provided by the first vibration generator 210 and the second vibration generator 220, by using the third vibration generator 230.

In an embodiment, the first vibration generator 210, second vibration generator 220 and third vibration generator 230 of the sound generator 200 are arranged to overlap each other in the thickness direction of the display panel 110, that is, in the third direction (Z-axis direction), such that the first vibration generator 210, the second vibration generator 220 and the third vibration generator 230 simultaneously vibrate the display panel 110 to output a sound. In such an embodiment, the first vibration generator 210, second vibration generator 220 and third vibration generator 230 simultaneously vibrate a same vibration surface to output a sound. In such an embodiment, the first vibration generator 210, the second vibration generator 220, and the third vibration generator 230 may vibrate the display panel 110 by distributing a sound band. The first vibration generator 210 may vibrate the display panel 110 to output a high frequency sound, the second vibration generator 220 may vibrate the display panel 110 to output a middle frequency sound, and the third vibration generator 230 may vibrate the display panel 110 to output a low frequency sound. Thus, the sound generator 200 may provide a high-quality sound having low, middle and high frequency bands. Accordingly, the user may hear a high-quality sound, and in such an embodiment, the speaker 103a for a woofer of the set support 103 may be omitted, thereby reducing the manufacturing cost thereof.

The bobbin 212 of the first vibration generator 210 may be in a cylindrical shape, and the second vibration generator 220 and the third vibration generator 230 may be disposed inside the bobbin 212 to be surrounded by the bobbin 212. The third vibration generator 230 may be disposed on one surface of the second vibration generator 220.

In an embodiment, the sound circuit board 250 may be connected not only to the second vibration generator 220 but also to the third vibration generator 230. In such an embodiment, the sound circuit board 250 may include a first pad and a second pad, which are connected to the first electrode 512 and second electrode 513 of the second vibration generator 220. The sound circuit board 250 may further include a third pad and a fourth pad, which are connected to the first sound line WL1 and second sound line WL2 of the third vibration generator 230. The first second driving voltage and second second driving voltage of the second sound signal of the sound driving circuit 171 may be applied to the first pad and the second pad. The first third driving voltage and second third driving voltage of the third sound signal of the sound driving circuit 171 may be applied to the third pad and the fourth pad.

The sound circuit board 250 and the third vibration generator 230 may be disposed on the second vibration generator 220. In an embodiment, as shown in FIG. 23, the third vibration generator 230 covers the sound circuit board 250 disposed on the second vibration generator 220. Alternatively, the third vibration generator 230 may be disposed only on the second vibration generator 220 on which the sound circuit board 250 is not disposed.

The sound driving circuit 171 may generate a first sound signal including the first first driving voltage and second first driving voltage for driving the first vibration generator 210 according to a sound control signal, may generate a second sound signal including the first second driving voltage and second second driving voltage for driving the second vibration generator 220 according to the sound control signal, and may generate a third sound signal including the first third driving voltage and second third driving voltage for driving the third vibration generator 230 according to the sound control signal.

The first vibration generator 210 may receive the first sound signal including the first first driving voltage and the second first driving voltage from the sound driving circuit 171. The first vibration generator 210 may output a sound by vibrating the display panel 110 according to the first first driving voltage and the second first driving voltage. In such an embodiment, where the sound driving circuit 171 and the lower plate 215 of the first vibration generator 210 are disposed on the control circuit board 160, the sound driving circuit 171 may be electrically connected to the first voice coil 213 of the first vibration generator 210 through the metal lines of the control circuit board 160.

The second vibration generator 220 may receive the second sound signal including the first second driving voltage and the second second driving voltage from the sound driving circuit 171. The second vibration generator 220 may output a sound by vibrating the display panel 110 according to the first second driving voltage and the second second driving voltage.

The third vibration generator 230 may receive the third sound signal including the first third driving voltage and the second third driving voltage from the sound driving circuit 171. The third vibration generator 230 may output a sound by vibrating the display panel 110 according to the first third driving voltage and the second third driving voltage.

In an embodiment, as shown in FIG. 3, the sound driving circuit 171 may be disposed on the control circuit board 160, the second vibration generator 220 may be disposed on one surface of the heat radiation film 130, and the third vibration generator 230 may be disposed on one surface of the second vibration generator 220. In such an embodiment, the second sound signal and third sound signal of the sound driving circuit 171 may be transmitted to the second vibration generator 220 and the third vibration generator 230 through the cable 150, the source circuit board 140, and the sound circuit board 250.

According to an embodiment, as shown in FIGS. 21 to 23, since the first vibration generator 210, second vibration generator 220 and third vibration generator 230 of the sound generator 200 are arranged to overlap each other in the thickness direction of the display panel 110, that is, in the third direction (Z-axis direction), the first vibration generator 210, the second vibration generator 220, and the third vibration generator 230 may simultaneously vibrate the display panel 110 to output a sound. Thus, since the first vibration generator 210, the second vibration generator 220, and the third vibration generator 230 may vibrate the display panel 110 by distributing a sound band, the sound generator 200 may provide a high-quality sound having low, middle and high frequency bands.

Figure 25:
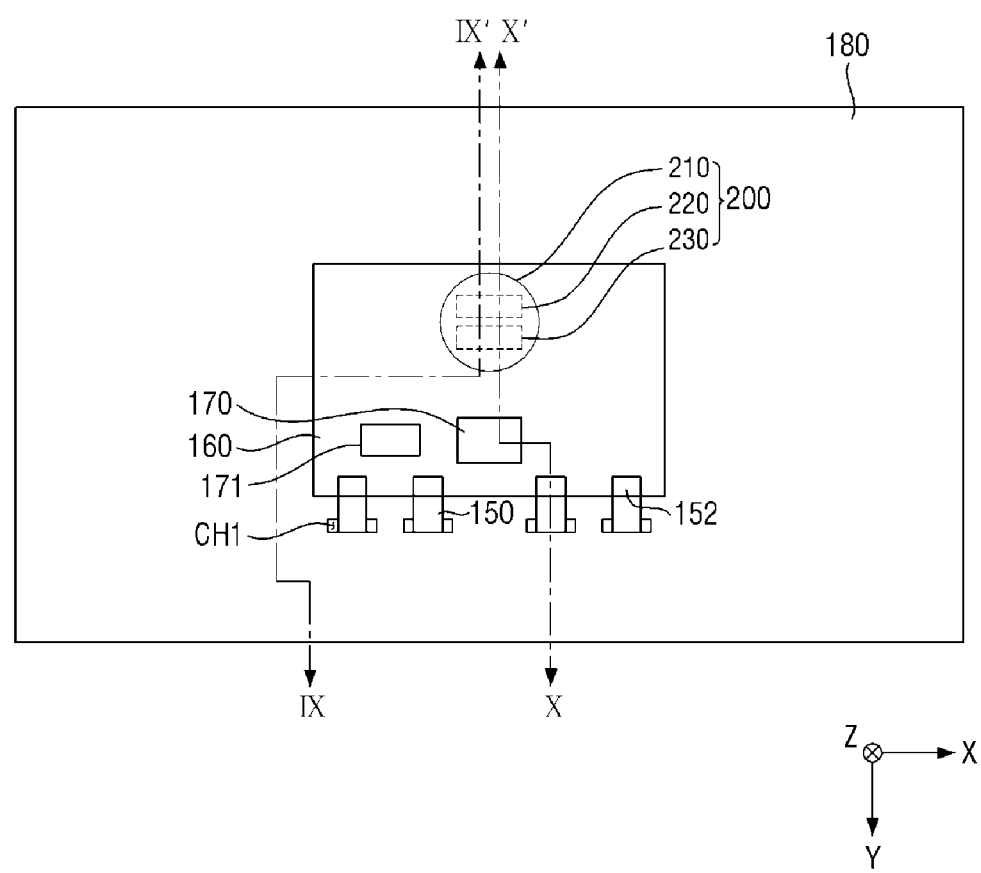
FIG. 25 is a bottom view showing another alternative embodiment of a display device.
Figure 26:
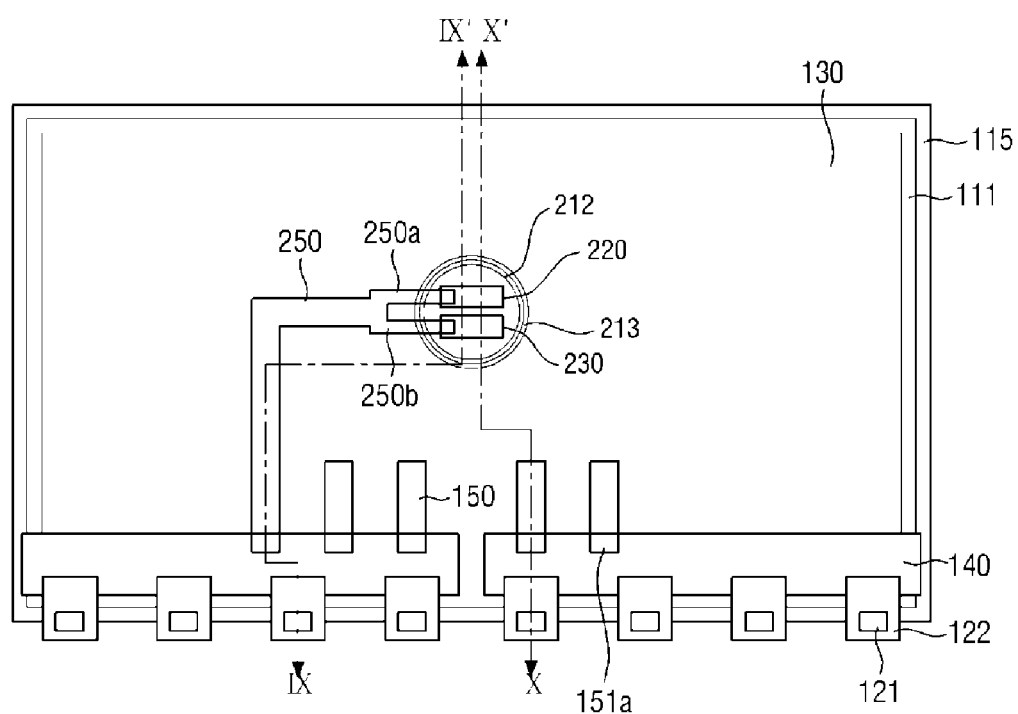
FIG. 26 is a bottom view showing an embodiment of a display device in a state where the lower cover and control circuit board in FIG. 25 are omitted.
Figure 26:
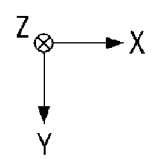
Figure 27:
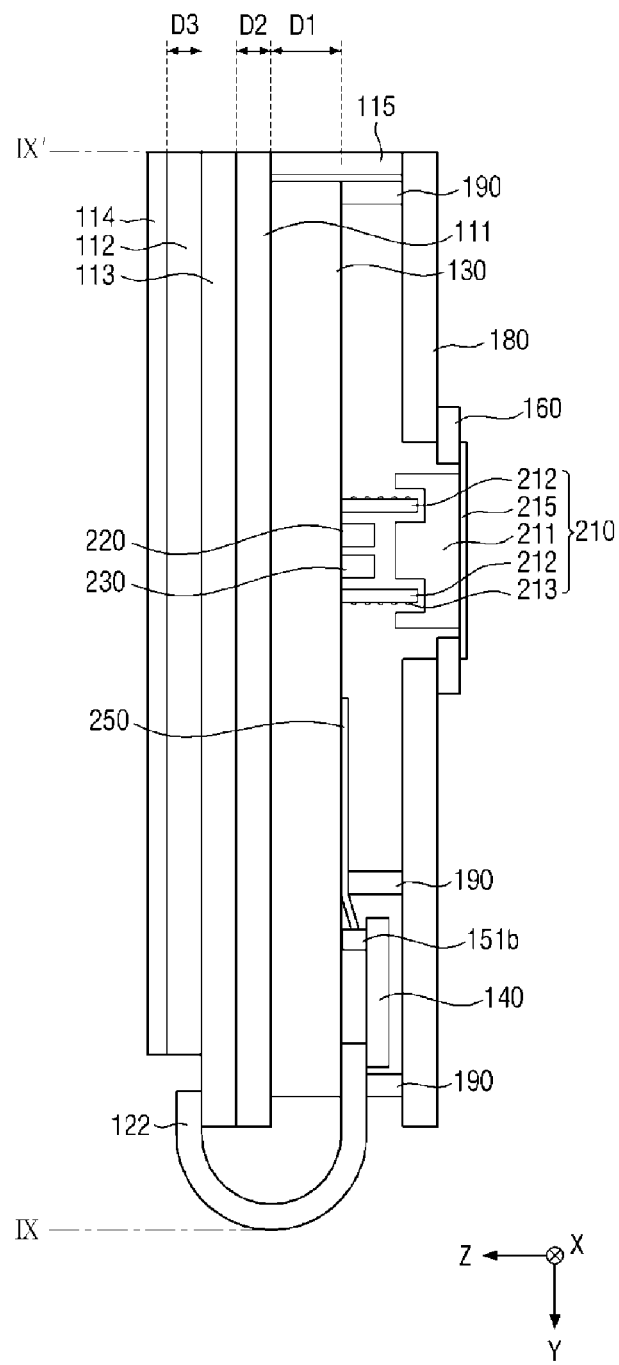
FIG. 27 is a cross-sectional view taken along IX-IX' of FIGS. 25 and 26.

FIG. 25 is a bottom view showing another alternative embodiment of a display device, FIG. 26 is a bottom view showing an embodiment of a display device where the lower cover and control circuit board in FIG. 25 are omitted, and FIG. 27 is a cross-sectional view taken along IX-IX' of FIGS. 25 and 26.

The embodiment shown in FIGS. 25 to 27 is substantially the same as the embodiment shown in FIGS. 21 to 23 except that the second vibration generator 220 and the third vibration generator 230 arranged in parallel to each other on the plane without overlapping each other in the thickness direction of the display panel 110, that is, in the third direction (Z-axis direction). The same or like elements shown in FIGS. 25 to 27 have been labeled with the same reference characters as used above to describe the embodiment of FIGS. 21 to 23, and any repetitive detailed description thereof will hereinafter be omitted or simplified. The cross-sectional view taken along line X-X' of FIGS. 25 and 26 is the same as that in the embodiment shown in FIG. 7 except that the second vibration generator 220 and the third vibration generator 230 are arranged inside the bobbin 212 in parallel to each other on the plane, and any repetitive detailed description thereof will be omitted.

Referring to FIGS. 25 to 27, in an embodiment, the second vibration generator 220 and the third vibration generator 230 may be arranged adjacent to each other in one direction, for example, in the second direction (Y-axis direction). In such an embodiment, one side surface of the second vibration generator 220 and one side surface of the third vibration generator 230 may be disposed adjacent to each other. In an embodiment, as illustrated in FIGS. 25 to 27, a gap exists between one side of the second vibration generator 220 and one side of the third vibration generator 230, which are adjacent to each other, but the invention is not limited thereto. Alternatively, one side of the second vibration generator 220 and one side of the third vibration generator 230, which are adjacent to each other, may be in contact with each other. The second vibration generator 220 and the third vibration generator 230 may be elongated in the other direction, for example, in the first direction (X-axis direction). One direction and the other direction may be directions crossing each other.

The second vibration generator 220 and the third vibration generator 230 may be disposed inside the bobbin 212 of the first vibration generator 210 to be surrounded by the bobbin 212. Each of the second vibration generator 220 and the third vibration generator 230 may overlap the first vibration generator 210. In an embodiment, each of the second vibration generator 220 and the third vibration generator 230 may overlap the first magnet 211 of the first vibration generator 210.

The sound circuit board 250 may be connected to the first electrode 512 and the second electrode 513 on one surface of the second vibration generator 220, and may be connected to the first sound line WL1 and the second sound line WL2 on one surface of the third vibration generator 230. Since the second vibration generator 220 and the third vibration generator 230 are arranged adjacent to each other in one direction in parallel to each other, one end of the sound circuit board 250 may be separated into a first connection portion 250a and a second connection portion 250b. The first connection portion 250a may include a first pad and a second pad connected to the first electrode 512 and second electrode 513 of the second vibration generator 220. The second connection portion 250b may include a third pad and a fourth pad connected to the first sound line WL1 and second sound line WL2 of the third vibration generator 230. The first second driving voltage and the second second driving voltage of the second sound signal of the sound driving circuit 171 may be applied to the first pad and second pad of the first connection portion 250a, and the first third driving voltage and second third driving voltage of the third sound signal of the sound driving circuit 171 may be applied to the third pad and fourth pad of the second connection portion 250b.

In an embodiment, as illustrated in FIG. 26, the first connection portion 250a and the second connection portion 250b are separated (or branched) from the sound circuit board 250 outside the bobbin 212 of the first vibration generator 210, but the invention is not limited thereto. Alternatively, the first connection portion 250a and the second connection portion 250b may be separated from the sound circuit board 250 inside the bobbin 212 of the first vibration generator 210.

According to an embodiment, as shown in FIGS. 25 to 27, the first vibration generator 210 and second vibration generator 220 of the sound generator 200 and the first vibration generator 210 and third vibration generator 230 of the sound generator 200 are respectively arranged to overlap each other in the thickness direction of the display panel 110, that is, in the third direction (Z-axis direction), such that the first vibration generator 210, the second vibration generator 220 and the third vibration generator 230 may simultaneously vibrate the display panel 110 to output a sound. Thus, since the first vibration generator 210, the second vibration generator 220, and the third vibration generator 230 may vibrate the display panel 110 by distributing a sound band, the sound generator 200 may provide a high-quality sound having low, middle and high frequency bands.

As described above, according to embodiments of the display device, the sound generator outputs a sound by using the display panel as a vibration plate, and thus the sound may be output in the front direction of the display device, thereby improving sound quality. In such an embodiment, by including the sound generator, a separate speaker disposed on the lower surface or one side of a conventional display panel may be omitted.

According to embodiments of a display device, the first vibration generator and second vibration generator of the sound generator are arranged to overlap each other in the thickness direction of the display panel, and thus the first vibration generator and the second vibration generator may simultaneously vibrate the display panel to output a sound. Accordingly, the first vibration generator and the second vibration generator may vibrate the display panel by distributing a sound band, and thus the sound generator may provide a high quality sound having both middle and high frequency bands.

In embodiments, the first vibration generator, the second vibration generator and the third vibration generator are arranged to overlap each other in the thickness direction of the display panel, and thus the first vibration generator, the second vibration generator and the third vibration generator may simultaneously vibrate the display panel to output a sound. Accordingly, the first vibration generator, the second vibration generator, and the third vibration generator may vibrate the display panel by distributing a sound band, and thus the sound generator may provide a high-quality sound having low, middle and high frequency bands.

In embodiments, the sound circuit board connected to the second vibration generator may be disposed between the heat radiation film and the bobbin of the first vibration generator or may be disposed in the accommodation groove of the heat radiation film. Thus, even when the second vibration generator is surrounded by the bobbin of the first vibration generator, the sound circuit board may electrically connect the second vibration generator and the source circuit board.

The invention should not be construed as being limited to the embodiments set forth herein. Rather, these embodiments are provided so that this disclosure will be thorough and complete and will fully convey the concept of the invention to those skilled in the art.

While the inventions have been particularly shown and described with reference to some embodiments thereof, it will be understood by one of ordinary skill in the art that various changes in form and detail may be made therein without departing from the spirit and scope of the invention as defined by the following claims.

What is claimed is:
1. A display device, comprising:
 a display panel including a first substrate and a light emitting element layer disposed on the first substrate; and
 a sound generator disposed on one surface of the first substrate, wherein the sound generator vibrates the display panel to output a sound, wherein the sound generator includes:
a first vibration generator which vibrates the display panel by generating a magnetic force using a first voice coil therein; and
a second vibration generator including a vibration layer which contracts or expands based on a voltage applied thereto to vibrate the display panel, the second vibration generator being disposed on the one surface of the first substrate,
wherein the first vibration generator and the second vibration generator overlap each other in a thickness direction of the display panel,
wherein the first vibration generator includes a bobbin disposed on the one surface of the first substrate, and
wherein the bobbin is one of disposed on the second vibration generator and surrounding the second vibration generator.

2. The display device of claim 1, wherein the second vibration generator is disposed directly on the one surface of the first substrate.

3. The display device of claim 1, wherein the first vibration generator further includes:
a first voice coil surrounding the bobbin; and
a first magnet disposed on the bobbin and spaced apart from the bobbin.

4. The display device of claim 3, wherein the second vibration generator overlaps the first magnet in the thickness direction of the display panel.

5. The display device of claim 3, wherein the second vibration generator further includes:
a first electrode to which a first driving voltage is applied; and
a second electrode to which a second driving voltage is applied,
wherein the vibration layer is disposed between the first electrode and the second electrode, and contracts and expands based on the first driving voltage applied to the first electrode and the second driving voltage applied to the second electrode.

6. The display device of claim 5, wherein the vibration layer includes a piezoelectric element.

7. The display device of claim 5, further comprising:
a sound circuit board electrically connected to the first electrode and second electrode of the second vibration generator.

8. The display device of claim 3, wherein the sound generator further includes a third vibration generator which vibrates the display panel by generating a magnetic force using a second voice coil therein.

9. The display device of claim 8, wherein the third vibration generator overlaps the first magnet of the first vibration generator in the thickness direction of the display panel.

10. The display device of claim 8, wherein the third vibration generator overlaps the first vibration generator and the second vibration generator in the thickness direction of the display panel.

11. The display device of claim 10, wherein the third vibration generator overlaps the first magnet of the first vibration generator in the thickness direction of the display panel.

12. The display device of claim 8, wherein the second vibration generator and the third vibration generator are surrounded by the bobbin.

13. The display device of claim 12, wherein
the second vibration generator is disposed on the one surface of the first substrate, and
the third vibration generator is disposed on the second vibration generator.

14. The display device of claim 8, wherein one side surface of the second vibration generator and one side surface of the third vibration generator are disposed adjacent to each other.

15. The display device of claim 8, wherein one side surface of the second vibration generator and one side surface of the third vibration generator are in contact with each other.

16. The display device of claim 8, wherein the third vibration generator includes:
a lower chassis and an upper chassis facing each other;
a flexible circuit board disposed on one surface of the lower chassis facing the upper chassis;
a second magnet including a voice coil groove which accommodates the second voice coil; and
a spring disposed between the upper chassis and the second magnet,
wherein the second voice coil is disposed on one surface of the flexible circuit board facing the upper chassis, and is electrically connected to the flexible circuit board.

17. A display device, comprising:
a display panel including a first substrate and a light emitting element layer disposed on the first substrate; and
a sound generator disposed on one surface of the first substrate, wherein the sound generator vibrates the display panel to output a sound,
wherein the sound generator includes:
a first vibration generator which vibrates the display panel by generating a magnetic force using a first voice coil therein; and
a second vibration generator including a vibration layer which contracts or expands based on a voltage applied thereto to vibrate the display panel,
wherein the first vibration generator and the second vibration generator overlap each other in a thickness direction of the display panel,
wherein the first vibration generator includes:
a bobbin disposed on the one surface of the first substrate;
a first voice coil surrounding the bobbin; and
a first magnet disposed on the bobbin and spaced apart from the bobbin,
wherein
the second vibration generator is disposed on the one surface of the first substrate, and
the bobbin is disposed on the second vibration generator,
wherein the first magnet has a cylindrical shape, a central protrusion of the first magnet is disposed inside the bobbin, and the side wall of the first magnet may be disposed outside the bobbin.

18. A display device, comprising:
a display panel including a first substrate and a light emitting element layer disposed on the first substrate; and
a sound generator disposed on one surface of the first substrate, wherein the sound generator vibrates the display panel to output a sound,
wherein the sound generator includes:
a first vibration generator which vibrates the display panel by generating a magnetic force using a first voice coil therein;
a second vibration generator including a vibration layer which contracts or expands based on a voltage applied thereto to vibrate the display panel; and a sound circuit board electrically connected to the first electrode and second electrode of the second vibration generator, wherein the first vibration generator and the second vibration generator overlap each other in a thickness direction of the display panel, wherein the first vibration generator includes:
a bobbin disposed on the one surface of the first substrate;
a first voice coil surrounding the bobbin; and
a first magnet disposed on the bobbin and spaced apart from the bobbin, wherein the second vibration generator further includes:
a first electrode to which a first driving voltage is applied; and
a second electrode to which a second driving voltage is applied, wherein the vibration layer is disposed between the first electrode and the second electrode, and contracts and expands based on the first driving voltage applied to the first electrode and the second driving voltage applied to the second electrode, wherein the sound circuit board is disposed between the one surface of the first substrate and the bobbin.

19. The display device of claim 18, wherein the sound circuit board is in contact with the bobbin.

20. The display device of claim 18, further comprising:
a heat radiation film disposed on the one surface of the first substrate and the sound generator,
wherein the heat radiation film includes an accommodation groove in which the sound circuit board is disposed.

21. The display device of claim 20, wherein the bobbin overlaps the accommodation groove in the thickness direction of the display panel.

22. The display device of claim 20, further comprising:
a lower cover disposed on the heat radiation film; and
a circuit board disposed on the lower cover.

23. The display device of claim 22, wherein a radio wave blocking member is disposed on the sound circuit board.

24. The display device of claim 22, wherein the first vibration generator further includes a lower plate disposed on the first magnet and fixed to the lower cover or the circuit board by a fixing member.

* * * * *